(12) United States Patent
Hendrix et al.

(10) Patent No.: US 10,186,570 B2
(45) Date of Patent: Jan. 22, 2019

(54) ALD PROCESSES FOR LOW LEAKAGE CURRENT AND LOW EQUIVALENT OXIDE THICKNESS BITAO FILMS

(71) Applicants: Entegris, Inc., Billerica, MA (US); ATMI Korea Co., Ltd, Suwon (KR)

(72) Inventors: Bryan C. Hendrix, Danbury, CT (US); Philip S. H. Chen, Bethel, CT (US); Weimin Li, New Milford, CT (US); Woosung Jang, Gyeong Gi-Do (KR); Dingkai Guo, Danbury, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 14/765,161

(22) PCT Filed: Feb. 5, 2014

(86) PCT No.: PCT/US2014/014954
§ 371 (c)(1),
(2) Date: Jul. 31, 2015

(87) PCT Pub. No.: WO2014/124056
PCT Pub. Date: Aug. 14, 2014

(65) Prior Publication Data
US 2015/0364537 A1     Dec. 17, 2015

Related U.S. Application Data

(60) Provisional application No. 61/762,352, filed on Feb. 8, 2013, provisional application No. 61/895,380, filed
(Continued)

(51) Int. Cl.
*H01L 29/94* (2006.01)
*H01L 49/02* (2006.01)
(Continued)

(52) U.S. Cl.
CPC ............ *H01L 28/55* (2013.01); *C01G 23/003* (2013.01); *C01G 25/006* (2013.01); *C01G 35/00* (2013.01);
(Continued)

(58) Field of Classification Search
CPC .. H01L 31/0376; H01L 31/20; H01L 31/0392
(Continued)

(56) References Cited

U.S. PATENT DOCUMENTS

| 4,915,988 A | 4/1990 | Erbil |
| 4,927,670 A | 5/1990 | Erbil |

(Continued)

FOREIGN PATENT DOCUMENTS

| EP | 0904568 B1 | 4/2001 |
| EP | 1645656 A1 | 4/2006 |

(Continued)

OTHER PUBLICATIONS

Yamamoto et al. Structural and electrical properties of Hf La O x films for an amorphous high- k gate insulator. Applied Physics Letters 89, 032903 2006.*

(Continued)

*Primary Examiner* — Noah Wiese
(74) *Attorney, Agent, or Firm* — Entegris, Inc. Legal Dept.; Nidhi G. Kissoon

(57) ABSTRACT

A high dielectric constant (k≥40), low leakage current (≤$10^{-6}$ A/cm$^2$ at 0.6 nm or lower equivalent oxide thickness) non-crystalline metal oxide is described, including an oxide of two or more compatible metals selected from the group consisting of bismuth, tantalum, niobium, barium, strontium, calcium, magnesium, titanium, zirconium, hafnium, tin, and lanthanide series metals. Metal oxides of such type may be formed with relative proportions of constituent metals being varied along a thickness of such oxides, to (Continued)

enhance their stability. The metal oxide may be readily made by a disclosed atomic layer deposition process, to provide a metal oxide dielectric material that is usefully employed in DRAM and other microelectronic devices.

14 Claims, 16 Drawing Sheets

Related U.S. Application Data on Oct. 24, 2013, provisional application No. 61/903,491, filed on Nov. 13, 2013.

(51) Int. Cl.

| | | |
|---|---|---|
| *C23C 16/40* | (2006.01) | |
| *C23C 16/455* | (2006.01) | |
| *H01L 21/02* | (2006.01) | |
| *C01G 23/00* | (2006.01) | |
| *C01G 25/00* | (2006.01) | |
| *C01G 35/00* | (2006.01) | |
| *C23C 16/18* | (2006.01) | |

(52) U.S. Cl.
CPC .............. *C23C 16/18* (2013.01); *C23C 16/40* (2013.01); *C23C 16/45525* (2013.01); *C23C 16/45531* (2013.01); *H01L 21/0228* (2013.01); *H01L 21/02194* (2013.01); *H01L 21/02197* (2013.01); *H01L 21/02205* (2013.01); *H01L 21/02337* (2013.01); *H01L 28/40* (2013.01); *C01P 2006/40* (2013.01)

(58) Field of Classification Search
USPC .......................................... 257/310, 52, 710
See application file for complete search history.

(56) References Cited

U.S. PATENT DOCUMENTS

| | | | |
|---|---|---|---|
| 4,948,623 A | 8/1990 | Beach et al. | |
| 4,960,916 A | 10/1990 | Pazik | |
| 4,962,214 A | 10/1990 | Villacorta et al. | |
| 5,204,057 A | 4/1993 | Ishigami et al. | |
| 5,204,314 A | 4/1993 | Kirlin et al. | |
| 5,225,561 A | 7/1993 | Kirlin et al. | |
| 5,280,012 A | 1/1994 | Kirlin et al. | |
| 5,453,494 A | 9/1995 | Kirlin et al. | |
| 5,536,323 A | 7/1996 | Kirlin et al. | |
| 5,555,154 A | 9/1996 | Uchikawa et al. | |
| 5,711,816 A | 1/1998 | Kirlin et al. | |
| 5,721,043 A | 2/1998 | Summerfelt et al. | |
| 5,753,934 A | 5/1998 | Yano et al. | |
| 5,770,921 A | 6/1998 | Aoki et al. | |
| 5,810,923 A | 9/1998 | Yano et al. | |
| 5,820,664 A | 10/1998 | Gardiner et al. | |
| 5,837,417 A | 11/1998 | Rahman et al. | |
| 5,840,897 A | 11/1998 | Kirlin et al. | |
| 5,859,274 A | 1/1999 | Baum et al. | |
| 5,919,522 A | 7/1999 | Baum et al. | |
| 6,002,036 A | 12/1999 | Kadokura | |
| 6,024,847 A | 2/2000 | Rosenberg et al. | |
| 6,025,222 A | 2/2000 | Kimura et al. | |
| 6,087,500 A | 7/2000 | Fukuda et al. | |
| 6,110,529 A | 8/2000 | Gardiner et al. | |
| 6,110,531 A | 8/2000 | Paz de Araujo et al. | |
| 6,111,122 A | 8/2000 | Paw et al. | |
| 6,177,558 B1 | 1/2001 | Brennan et al. | |
| 6,218,518 B1 | 4/2001 | Baum et al. | |
| 6,255,122 B1 | 7/2001 | Duncombe et al. | |
| 6,277,436 B1 | 8/2001 | Stauf et al. | |
| 6,287,965 B1 | 9/2001 | Kang et al. | |
| 6,297,539 B1 | 10/2001 | Ma et al. | |
| 6,340,386 B1 | 1/2002 | Hendrix et al. | |
| 6,342,445 B1 | 1/2002 | Marsh | |
| 6,348,705 B1 | 2/2002 | Hendrix | |
| 6,440,495 B1 | 8/2002 | Wade et al. | |
| 6,479,100 B2 | 11/2002 | Jin et al. | |
| 6,506,666 B2 | 1/2003 | Marsh | |
| 6,511,706 B1 | 1/2003 | Hendrix et al. | |
| 6,562,678 B1 | 5/2003 | Uchiyama et al. | |
| 6,599,447 B2 | 7/2003 | Stauf et al. | |
| 6,646,122 B1 | 11/2003 | Nuhlen et al. | |
| 6,660,331 B2 | 12/2003 | Hendrix et al. | |
| 6,673,646 B2 | 1/2004 | Droopad | |
| 6,680,251 B2 | 1/2004 | Won et al. | |
| 6,743,739 B2 | 6/2004 | Shimamoto et al. | |
| 6,787,186 B1 | 9/2004 | Hintermaier | |
| 6,849,122 B1 | 2/2005 | Fair | |
| 6,900,498 B2 * | 5/2005 | Stauf .................. H01L 21/28291 257/295 |
| 6,911,402 B2 | 6/2005 | Lee et al. | |
| 6,916,944 B2 | 7/2005 | Furukawa et al. | |
| 6,960,538 B2 | 11/2005 | Ahn et al. | |
| 6,984,591 B1 | 1/2006 | Buchanan et al. | |
| 6,989,457 B2 | 1/2006 | Kamepalli et al. | |
| 7,038,284 B2 | 5/2006 | Haukka et al. | |
| 7,108,747 B1 | 9/2006 | Leskela et al. | |
| 7,211,509 B1 | 5/2007 | Gopinath et al. | |
| 7,250,367 B2 | 7/2007 | Vaartstra et al. | |
| 7,285,308 B2 | 10/2007 | Hendrix et al. | |
| 7,300,038 B2 | 11/2007 | Gregg et al. | |
| 7,371,633 B2 | 5/2008 | Lee et al. | |
| 7,393,736 B2 | 7/2008 | Ahn et al. | |
| 7,508,648 B2 | 3/2009 | Ahn et al. | |
| 7,615,830 B2 | 11/2009 | Lim et al. | |
| 7,625,794 B2 | 12/2009 | Ahn et al. | |
| 7,635,441 B2 | 12/2009 | Kadokura et al. | |
| 7,638,074 B2 | 12/2009 | Xu et al. | |
| 7,790,629 B2 | 9/2010 | Holme et al. | |
| 7,808,693 B2 * | 10/2010 | Nguyen ................. G02F 1/1508 359/270 |
| 8,034,407 B2 | 10/2011 | Hendrix et al. | |
| 8,092,721 B2 | 1/2012 | Gatineau et al. | |
| 8,206,784 B2 | 6/2012 | Xu et al. | |
| 8,221,852 B2 | 7/2012 | Heys et al. | |
| 8,455,049 B2 | 6/2013 | Cameron et al. | |
| 2002/0004266 A1 | 1/2002 | Hashimoto et al. | |
| 2002/0067917 A1 | 6/2002 | Takamatsu et al. | |
| 2002/0084456 A1 * | 7/2002 | Sugihara ................ H05K 1/162 257/48 |
| 2002/0090815 A1 | 7/2002 | Koike et al. | |
| 2002/0146513 A1 | 10/2002 | Jin et al. | |
| 2002/0167086 A1 | 11/2002 | Stauf et al. | |
| 2003/0012876 A1 | 1/2003 | Min et al. | |
| 2003/0020122 A1 | 1/2003 | Joo et al. | |
| 2003/0032238 A1 | 2/2003 | Kim et al. | |
| 2003/0038594 A1 | 2/2003 | Seo et al. | |
| 2003/0072882 A1 | 4/2003 | Niinisto et al. | |
| 2003/0129306 A1 | 7/2003 | Wade et al. | |
| 2003/0165615 A1 | 9/2003 | Aaltonen et al. | |
| 2003/0205823 A1 | 11/2003 | Leu et al. | |
| 2004/0038808 A1 | 2/2004 | Hampden-Smith et al. | |
| 2004/0043149 A1 | 3/2004 | Gordon et al. | |
| 2004/0166671 A1 | 8/2004 | Lee et al. | |
| 2004/0173918 A1 | 9/2004 | Kamal et al. | |
| 2004/0197946 A1 | 10/2004 | Vaartstra et al. | |
| 2004/0211998 A1 | 10/2004 | Araujo et al. | |
| 2004/0214354 A1 | 10/2004 | Marsh et al. | |
| 2004/0224087 A1 | 11/2004 | Weimer et al. | |
| 2004/0238861 A1 | 12/2004 | Hwang et al. | |
| 2005/0009325 A1 | 1/2005 | Chung et al. | |
| 2005/0014352 A1 | 1/2005 | Torii et al. | |
| 2005/0153073 A1 | 7/2005 | Zheng et al. | |
| 2005/0186341 A1 | 8/2005 | Hendrix et al. | |
| 2005/0208699 A1 | 9/2005 | Furkay et al. | |
| 2005/0217575 A1 | 10/2005 | Gealy et al. | |
| 2005/0277780 A1 | 12/2005 | Gordon et al. | |
| 2006/0006449 A1 | 1/2006 | Jeong et al. | |
| 2006/0027451 A1 | 2/2006 | Park et al. | |
| 2006/0035462 A1 | 2/2006 | Millward | |
| 2006/0049447 A1 | 3/2006 | Lee et al. | |

(56) References Cited

U.S. PATENT DOCUMENTS

| | | | |
|---|---|---|---|
| 2006/0102895 A1* | 5/2006 | Hendrix | C07F 9/00 257/40 |
| 2006/0115595 A1 | 6/2006 | Shenai-Khatkhate et al. | |
| 2006/0118968 A1 | 6/2006 | Johnston et al. | |
| 2006/0128150 A1 | 6/2006 | Gandikota et al. | |
| 2006/0138393 A1 | 6/2006 | Seo et al. | |
| 2006/0172067 A1 | 8/2006 | Ovshinsky et al. | |
| 2006/0172083 A1 | 8/2006 | Lee et al. | |
| 2006/0180811 A1 | 8/2006 | Lee et al. | |
| 2006/0223931 A1 | 10/2006 | Park et al. | |
| 2006/0244100 A1 | 11/2006 | Ahn et al. | |
| 2006/0275545 A1 | 12/2006 | Yoshinaka et al. | |
| 2006/0288928 A1 | 12/2006 | Eom et al. | |
| 2007/0004226 A1 | 1/2007 | Tweet et al. | |
| 2007/0026608 A1 | 2/2007 | Choi et al. | |
| 2007/0049021 A1 | 3/2007 | Basceri | |
| 2007/0053139 A1 | 3/2007 | Zhang et al. | |
| 2007/0054487 A1 | 3/2007 | Ma et al. | |
| 2007/0082415 A1 | 4/2007 | Jeon et al. | |
| 2007/0116888 A1 | 5/2007 | Faguet | |
| 2007/0154637 A1 | 7/2007 | Shenai-Khatkhate et al. | |
| 2007/0190362 A1 | 8/2007 | Weidman | |
| 2007/0262715 A1 | 11/2007 | Yan et al. | |
| 2008/0118731 A1 | 5/2008 | Srinivasan et al. | |
| 2008/0182427 A1 | 7/2008 | Oberbeck et al. | |
| 2008/0193642 A1 | 8/2008 | Yoon et al. | |
| 2008/0194088 A1 | 8/2008 | Srinivasan et al. | |
| 2008/0199975 A1 | 8/2008 | Park et al. | |
| 2008/0230854 A1 | 9/2008 | Clark | |
| 2008/0242111 A1 | 10/2008 | Holme et al. | |
| 2008/0254218 A1 | 10/2008 | Lei et al. | |
| 2008/0254232 A1 | 10/2008 | Gordon et al. | |
| 2008/0317972 A1 | 12/2008 | Hendriks et al. | |
| 2009/0001618 A1 | 1/2009 | Kadokura et al. | |
| 2009/0002917 A1 | 1/2009 | Kil et al. | |
| 2009/0004383 A1 | 1/2009 | Kadokura et al. | |
| 2009/0032952 A1* | 2/2009 | Chen | C23C 16/18 257/751 |
| 2009/0057737 A1 | 3/2009 | Boescke et al. | |
| 2009/0058953 A1 | 3/2009 | Arakawa et al. | |
| 2009/0074965 A1 | 3/2009 | Xu et al. | |
| 2009/0087561 A1 | 4/2009 | Chen et al. | |
| 2009/0136658 A1 | 5/2009 | Yoshinaka et al. | |
| 2009/0215225 A1 | 8/2009 | Stender et al. | |
| 2009/0275164 A1 | 11/2009 | Chen et al. | |
| 2009/0321733 A1 | 12/2009 | Gatineau et al. | |
| 2010/0015800 A1 | 1/2010 | Hara et al. | |
| 2010/0062150 A1 | 3/2010 | Xu et al. | |
| 2010/0095865 A1 | 4/2010 | Xu et al. | |
| 2010/0112211 A1 | 5/2010 | Xu et al. | |
| 2010/0291299 A1 | 11/2010 | Cameron et al. | |
| 2011/0195188 A1 | 8/2011 | Hendrix et al. | |
| 2011/0215679 A1 | 9/2011 | Naono | |
| 2011/0292134 A1 | 12/2011 | Sasaki et al. | |
| 2012/0064719 A1 | 3/2012 | Lubguban, Jr. et al. | |
| 2012/0127629 A1 | 5/2012 | Roeder et al. | |
| 2012/0141675 A1 | 6/2012 | Xu et al. | |
| 2013/0251918 A1 | 9/2013 | Cameron et al. | |
| 2014/0134823 A1 | 5/2014 | Hendrix et al. | |
| 2014/0295071 A1 | 10/2014 | Xu et al. | |

FOREIGN PATENT DOCUMENTS

| | | |
|---|---|---|
| EP | 1798307 A1 | 6/2007 |
| EP | 2000561 A1 | 12/2008 |
| JP | 2-225317 A | 9/1990 |
| JP | 7-70747 A | 3/1995 |
| JP | 7-249616 A | 9/1995 |
| JP | 10-125237 A | 5/1998 |
| JP | 10-273779 A | 10/1998 |
| JP | 2004-527651 A | 9/2004 |
| JP | 2006-37123 A | 2/2006 |
| KR | 20010056446 A | 7/2001 |
| KR | 20010088207 A | 9/2001 |
| KR | 10-0443350 B1 | 7/2004 |
| KR | 1020040100766 A | 12/2004 |
| KR | 1020060097807 A | 9/2006 |
| KR | 10-2008-0079514 A | 9/2008 |
| KR | 10-2009-0109720 A | 10/2009 |
| KR | 10-2011-0060749 A | 6/2011 |
| SU | 768457 A | 10/1980 |
| TW | 200912030 A | 3/2009 |
| WO | 0015865 A1 | 3/2000 |
| WO | 0166834 A2 | 9/2001 |
| WO | 2004046417 A2 | 6/2004 |
| WO | 2006012052 A2 | 2/2006 |
| WO | 2006132107 A1 | 12/2006 |
| WO | 2007064376 A2 | 6/2007 |
| WO | 2008088563 A2 | 7/2008 |
| WO | 2008117582 A1 | 10/2008 |
| WO | 2008128141 A2 | 10/2008 |
| WO | 2009020888 A1 | 2/2009 |
| WO | 2010123531 A1 | 10/2010 |

OTHER PUBLICATIONS

Ju, Y., et al., "Growth of Thin-Film Layered Perovskite Cathodes by Pulsed Laser Deposition and their Electrochemical Studies in IT-SOFCs", "Journal of the Electrochemical Society", Apr. 18, 2014, pp. F698-F702, vol. 161, No. 6.

Kirlin, P., et al., "Thin Films of Barium Fluoride Scintillator Deposited by Chemical Vapor Deposition", "Nuclear Instruments and Methods in Physics Research", 1990, pp. 261-264, vol. A289.

Kirlin, P., et al., "Growth of High Tc YBaCuO Thin Films by Metalorganic Chemical Vapor Deposition", "SPIE", 1989, pp. 115-127, vol. 1187.

Kosola, A., et al., "Effect of annealing in processing of strontium titanate thin films by ALD", "Applied Surface Science", 2003, pp. 102-112, vol. 211.

Kvyatkovskii, O., "On the Nature of Ferroelectricity in Sr1—xAxTiO3 and KTa1—xNbxO3 Solid Solutions", "Physics of the Solid State", 2002, pp. 1135-1144, vol. 44, No. 6.

Leskela, M., et al., "Atomic layer deposition chemistry: recent developments and future challenges", "Angew. Chem. Int. Ed.", Nov. 24, 2003, pp. 5548-5554, vol. 42, No. 45.

Lu, H., et al., "Evolution of itinerant ferromagnetism in SrxPb1—xRuO3 (0 less than or equal to x less than or equal to 1): Interplay between Jahn-Teller distortion and A-site disorder", "Applied Physics Letters", Mar. 22, 2011, pp. 1-3, vol. 98, No. 122503.

Macomber, D., et al., "(n5-Cyclopentadienyl)- and (n5-Pentamethylcyclopentadienyl)copper Compounds Containing Phosphine, Carbonyl, and n2-Acetylenic Ligands", "J. Am. Chem. Soc.", 1983, pp. 5325-5329, vol. 105.

Marozau, I., et al., "RF-plasma assisted pulsed laser deposition of nitrogen-doped SrTiO3 thin films", "Appl Phys A", Jun. 13, 2008, pp. 721-727, vol. 93.

McCormick, M., et al., "Solution Synthesis of Calcium, Strontium, and Barium Metallocenes", "Polyhedron", 1988, pp. 725-730, vol. 7, No. 9.

Niinistoe, J., et al., "Atomic Layer Deposition of High-k Oxides of the Group 4 Metals for Memory Applications", "Advanced Engineering Materials", Mar. 9, 2009, pp. 223-234, vol. 11, No. 4.

Papadatos, F., et al., "Characterization of Ruthenium and Ruthenium Oxide Thin Films deposited by Chemical Vapor Deposition for CMOS Gate Electrode Applications", "Mat. Res. Soc. Symp. Proc.", 2003, pp. N3.3.1-N3.3.6, vol. 745.

Ren, H., et al., "Synthesis and structures of cyclopentadienyl N-heterocyclic carbene copper(I) complexes", "Journal of Organometallic Chemistry", Jun. 21, 2006, pp. 4109-4113, vol. 691.

Roeder, J., et al., "High k Dielectrics: Properties, Processing, and Implications for Back-end Integration", "Proc. of the 8th International Dielectrics and Conductors for ULSI Multilevel Interconnection Conference", Feb. 28-Mar. 1, 2002, pp. 1-12, Published in: Santa Clara, CA.

Selg, P., et al., "Solution Infrared Spectroscopic Studies on Equilibrium Reactions of Co With the Decamethylmetallocenes CP2MII,

(56) References Cited

OTHER PUBLICATIONS

Where M=Mg, Ca, Sr, Ba, Sm, Eu, Yb", "Organometallics", Jun. 22, 2002, pp. 3100-3107, vol. 21, No. 15.

Singh, R., et al., "In-Situ Processing of Epitaxial Y—Ba—Cu—O High Tc Superconducting Films on (100) SrTiO3 and (100) YS—ZrO2 Substrates at 500-650 Degrees Celsius", "Applied Physics Letters", May 29, 1989, pp. 2271-2273, vol. 54, No. 22.

Stauf, G., et al., "MOCVD of Alkaline Earth Titanates for Integrated RF Capacitors", "Proceedings of the Fall 1997 Materials Research Society Meeting, Ferroelectric Films VI", 1997, p. 503 vol. 493.

University of Minnesota, "The Transition Metals", Accessed via Internet Jan. 2014, pp. 1-44.

Vehkamaki, M., et al., "Growth of SrTiO3 and BaTiO3 Thin Films by Atomic Layer Deposition", "Electrochemical Solid-State Letters", Aug. 5, 1999, pp. 504-506, vol. 2, No. 10.

Vehkamaki, M., et al., "Atomic Layer Deposition of SrTiO3 Thin Films from a Novel Strontium Precursor-Strontium-bis(tri-isopropylcyclopentadienyl)", "Chemical Vapor Deposition", Mar. 2001, pp. 75-80, vol. 7, No. 2.

Wu, L., et al., "Humidity Sensitivity of Sr(Sn, Ti)03 Ceramics", "Journal of Electronic Materials", 1990, pp. 197-200, vol. 19, No. 2.

Anderson, Q., et al., "Synthesis and Characterization of the First Pentaphenylcyclopentadienyl Copper(I) Complex, (Ph5Cp)Cu(PPh3)", "Organometallics", 1998, pp. 4917-4920, vol. 17.

Artaud-Gillet, M., et al., "Evaluation of copper organometallic sources for CuGaSe2 photovoltaic applications", "Journal of Crystal Growth", 2003, pp. 163-168, vol. 248.

Burns, C., et al., "Organometallic Coordination Complexes of the BIS (Pentamethylcyclopentadienyl)-Alkaline Earth Compounds, (ME5C5)2MLN, Where M is Mg, Ca, Sr, or Ba and ME5C5BECL", "Journal of Organometallic Chemistry", 1987, pp. 31-37, vol. 325.

Christen, H., et al., "Semiconducting epitaxial films of metastable SrRu0.5Sn0.5O3 grown by pulsed laser deposition", "Applied Physics Letters", 1997, pp. 2147-2149 (Title and Abstract), vol. 70, No. 16.

Furukawa, T., et al., "Development of a Novel Bismuth Precursor for MOCVD", "TOSOH Research and Technology Review", 2006, pp. 41-44, vol. 50.

Habermeier, H., "Thin films of perovskite-type complex oxides", "Materials Today", Oct. 2007, pp. 34-43, vol. 10, No. 10.

Hatanpaa, T., et al., "Synthesis and characterisation of cyclopentadienyl complexes of barium: precursors for atomic layer deposition of BaTiO3", "Dalton Trans.", Mar. 22, 2004, pp. 1181-1188, vol. 8.

Hendrix, B., et al., "High-k MIM Capacitors for Integration in Low Thermal Budget Applications", "Proceedings of the AMC Conference (MRS)", 2001, pp. 471-477 (Author's Manuscript Version), Published in: Montreal, Canada.

Holme, T., et al., "Atomic Layer Deposition and Chemical Vapor Deposition Precursor Selection Method Application to Strontium and Barium Precursors", "J. Phys. Chem.", Jul. 27, 2007, pp. 8147-8151, vol. 111, No. 33.

\* cited by examiner

ALD PROCESSES FOR LOW LEAKAGE CURRENT AND LOW EQUIVALENT OXIDE THICKNESS BITAO FILMS

CROSS-REFERENCE TO RELATED APPLICATIONS

This application is a U.S. national phase under the provisions of 35 U.S.C. § 371 of International Patent Application No. PCT/US14/14954 filed Feb. 5, 2014, which in turn claims the benefit of the following U.S. Provisional Patent Applications under the provisions of 35 USC 119: U.S. Provisional Patent Application 61/762,352 filed Feb. 8, 2013; U.S. Provisional Patent Application 61/895,380 filed Oct. 24, 2013; and U.S. Provisional Patent Application 61/903,491 filed Nov. 13, 2013. The disclosures of such international patent application and all such U.S. Provisional Patent Applications are hereby incorporated herein by reference, in their respective entireties, for all purposes.

FIELD

The present disclosure relates to high dielectric constant (k), low leakage current non-crystalline metal oxides, and processes for making same.

DESCRIPTION OF THE RELATED ART

Silicon dioxide ($SiO_2$) has been used for many decades as a capacitor dielectric material. As transistors have decreased in size, thicknesses of dielectric materials have steadily decreased, in order to correspondingly increase charge storage per unit area of the device. At thicknesses below 2 nm, however, leakage currents due to tunneling increase drastically, leading to high power consumption and decreased device reliability. Capacitor structures have increased in aspect ratio in order to increase their effective area, and dielectric films have been scaled to utilize higher k materials, including $Al_2O_3$, $Ta_2O_5$, $HfO_2$, and $ZrO_2$, and more recently $ZrO_2$ modified with $Al_2O_3$ to achieve lower leakage. However, as equivalent oxide thickness (EOT) of such materials has been reduced below 0.6, the film leakage becomes too high for practical use.

There is therefore a need in the art for high dielectric constant (k) films that can be formed by atomic layer deposition (ALD) and have low current leakage character at EOT thicknesses below 0.6 nm.

SUMMARY

The present disclosure relates to high dielectric constant ($k \geq 40$, low leakage current ($\leq 10^{-6}$ $A/cm^2$ at 0.6 nm or lower equivalent oxide thickness) non-crystalline metal oxide materials and processes for forming such materials.

In one aspect, the disclosure relates to a high dielectric constant, low leakage current non-crystalline metal oxide, comprising an oxide of two or more compatible metals selected from the group consisting of bismuth, tantalum, niobium, barium, strontium, calcium, magnesium, titanium, zirconium, hafnium, tin, and lanthanide series metals. The composition can be uniform through the thickness of the film, modulated at the surfaces to improve surface compatibility, or modulated through numerous cycles through the thickness of the film in order to improve stability relative to subsequent processing steps.

In a further aspect, the disclosure relates to a high dielectric constant, low leakage current non-crystalline metal oxide, comprising BiTaO or lanthanum tantalate.

In another aspect, the disclosure relates to a method of forming a high dielectric constant, low leakage current non-crystalline metal oxide, comprising depositing on a substrate in an atomic layer deposition process a first metal in a first pulsed deposition step, reacting the deposited first metal with an oxic co-reactant to form an oxide of the first metal, and depositing on the substrate in the atomic layer deposition process a second metal in a subsequent pulsed deposition step, to form a mixed metal oxide as said high dielectric constant, low leakage current non-crystalline metal oxide, wherein the metals in said mixed metal oxide comprise two or more compatible metals selected from the group consisting of bismuth, tantalum, niobium, barium, strontium, calcium, magnesium, titanium, zirconium, hafnium, tin, and lanthanide series metals.

Yet another aspect of the disclosure relates to a method of manufacturing a high dielectric constant, low leakage current non-crystalline metal oxide of the disclosure, such method comprising depositing on a substrate in an atomic layer deposition process a mixed metal oxide comprising two or more compatible metals selected from the group consisting of bismuth, tantalum, niobium, barium, strontium, calcium, magnesium, titanium, zirconium, hafnium, tin, and lanthanide series metals, wherein the mixed metal oxide is formed as a non-crystalline ALD film having a dielectric constant greater than 50, and thermally treating the non-crystalline ALD film for sufficient time and at sufficient temperature to yield the high dielectric constant, low leakage current non-crystalline metal oxide, wherein the thermally treating comprises thermal treatment of the film in an oxidizing environment.

In another aspect, the disclosure relates to a high dielectric constant, low leakage current non-crystalline metal oxide, comprising an oxide of two or more compatible metals selected from the group consisting of bismuth, tantalum, niobium, barium, strontium, calcium, magnesium, titanium, zirconium, hafnium, tin, and lanthanide series metals, in which the metal oxide comprises different relative proportions of the metals therein.

A still further aspect of the disclosure relates to a process of forming a high dielectric constant, low leakage current non-crystalline metal oxide, including two or more compatible metals selected from the group consisting of bismuth, tantalum, niobium, barium, strontium, calcium, magnesium, titanium, zirconium, hafnium, tin, and lanthanide series metals, comprising vapor depositing the metals on a substrate at at least two differing ratios of the metals during said depositing, so that the metal oxide comprises different relative proportions of the metals therein, for enhancement of stability of such metal oxide.

Other aspects, features and embodiments of the disclosure will be more fully apparent from the ensuing description and appended claims.

DETAILED DESCRIPTION

Figure 1:
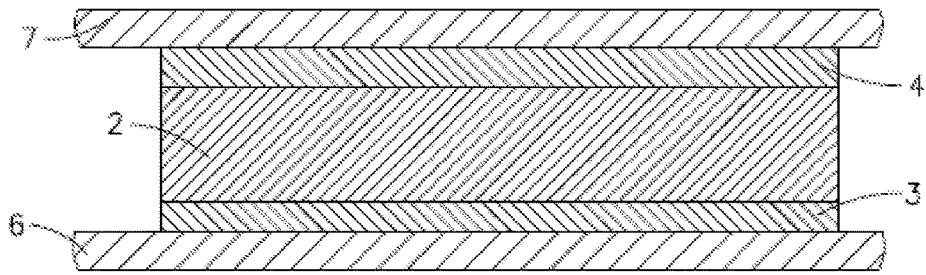
FIG. 1 is a schematic representation of a generalized high dielectric constant capacitor including a high k, low current leakage material of the present disclosure.

The present disclosure relates to high dielectric constant ($k \geq 40$), low leakage current ($\leq 10^{-6}$ $A/cm^2$ at 0.6 nm or lower equivalent oxide thickness) non-crystalline metal oxide materials and processes for making such materials by atomic layer deposition (ALD).

As used herein and in the appended claims, the singular forms "a", "and", and "the" include plural referents unless the context clearly dictates otherwise.

The disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the disclosure. The disclosure correspondingly contemplates such features, aspects and embodiments, or a selected one or ones thereof, in various permutations and combinations, as being within the scope of the present disclosure.

As used herein, the term "film" refers to a layer of deposited material having a thickness below 1000 micrometers, e.g., from such value down to atomic monolayer thickness values. In various embodiments, film thicknesses of deposited material layers in the practice of the invention may for example be below 100, 10, or 1 micrometers, or in various thin film regimes below 200, 100, or 50 nanometers, depending on the specific application involved. Typical dielectric thickness for high aspect ratio capacitors in DRAM devices is 3 to 12 nanometers. As used herein, the term "thin film" means a layer of a material having a thickness below 1 micrometer.

As used herein, the term "lower" in reference to hydrocarbon groups means a linear, branched, or cyclic hydrocarbon group having from 1 to 6 carbon atoms in the group referenced by such term.

The disclosure relates in one aspect to a high dielectric constant, low leakage current non-crystalline metal oxide, comprising an oxide of two or more compatible metals selected from the group consisting of bismuth, tantalum, niobium, barium, strontium, calcium, magnesium, titanium, zirconium, hafnium, tin, and lanthanide series metals. In a specific embodiment, the metals may be selected from the group consisting of bismuth, tantalum, lanthanum, titanium, barium, strontium, zirconium, and tin.

The metal oxide of such character may for example comprise a metal oxide such as BiTaO, LnTaO, LnTiO, (Ba,Sr) tetratitanates, or ZrTiSnO, wherein Ln is a lanthanide series element, e.g., lanthanum, cerium, prasoedymium, neodymium, samarium, europium, gadolinium, terbium, dysprosium, holmium, erbium, or ytterbium. The notation $M^1M^2O$ is used herein to indicate a mixture of the oxide of $M^1$ with the oxide of $M^2$ over a broad range from 5-95% on a metals basis. For example, BiTaO indicates a mixture of $Bi_2O_3$ and $Ta_2O_5$. When reference is made to a mixture as having 20% Bi, it is meant that there are 0.2 moles of Bi atoms for every 1 mole of Bi atoms+Ta atoms. The oxygen content of the film is not explicitly specified in such nomenclature.

The high dielectric constant, low leakage current non-crystalline metal oxide in various embodiments has a dielectric constant in a range of from 40 to 75. Metal oxides of the disclosure may additionally, or alternatively, have a leakage current in a range of from $10^{-6}$ $A/cm^2$ to $10^{-9}$ $A/cm^2$ at 0.6 nm or lower equivalent oxide thickness (EOT), e.g. at EOT of 0.5 nm. In some embodiments, the dielectric constant of the high dielectric constant, low leakage current non-crystalline metal oxide is in a range of from 45 to 75, and in other embodiments such dielectric constant is in a range of from 50 to 75. Higher dielectric constants, e.g., up to 90 or more, are useful in some applications and are contemplated in the broad practice of the present disclosure.

High dielectric constant, low leakage current metal oxides of the disclosure are usefully employed in capacitor, inductor, or transistor devices or otherwise in microelectronic or integrated circuit devices, such as DRAM devices.

In various embodiments, the high dielectric constant, low leakage current non-crystalline metal oxide of the disclosure comprises BiTaO or lanthanum tantalate, e.g., in the form of a film or more specifically a thin film.

The disclosure relates in another aspect to a method of forming a high dielectric constant, low leakage current non-crystalline metal oxide, comprising depositing on a substrate in an atomic layer deposition process a first metal in a first pulsed deposition step, reacting the deposited first metal with an oxic co-reactant to form an oxide of the first metal, and depositing on the substrate in the atomic layer deposition process a second metal in a subsequent pulsed deposition step, to form a mixed metal oxide as said high dielectric constant, low leakage current non-crystalline metal oxide, wherein the metals in such mixed metal oxide comprise two or more compatible metals selected from the group consisting of bismuth, tantalum, niobium, barium, strontium, calcium, magnesium, titanium, zirconium, hafnium, tin, and lanthanide series metals.

In this method, the oxic co-reactant may comprise ozone, or oxygen, or other oxidant. Other common examples include water, peroxides, and nitrogen oxides. The method of forming the metal oxide can be carried out at any suitable temperature, e.g., a temperature in a range of from 200° C. to 400° C.

The method may be carried out to form the high dielectric constant, low leakage current non-crystalline metal oxide, wherein the two or more compatible metals are selected from the group consisting of bismuth, tantalum, lanthanum, titanium, barium, strontium, zirconium, and tin. The mixed metal oxide can for example comprise any of BiTaO, LnTaO, LnTiO, (Ba,Sr) tetratitanates, and ZrTiSnO, wherein Ln comprises a lanthanide series metal.

The ALD method may be carried out using any suitable organometallic precursors for the metals of the mixed metal oxide. In one embodiment, wherein the mixed metal oxide comprises BiTaO, the atomic layer deposition process can be carried out using triphenylbismuth as a bismuth precursor therein. In other embodiments, the substituted phenylbismuth or substituted triphenylbismuth compounds hereinafter described may be employed. The tantalum precursor in various embodiments may for example comprise tris(diethylamino)(tert-butylimido)tantalum. [Ta=N-t-butyl($NEt_2$)$_3$]. In an atomic layer deposition process carried out with triphenylbismuth as a bismuth precursor therein, and tris (diethylamino)(tert-butylimino)tantalum. [Ta=N-t-butyl ($NEt_2$)$_3$], as a tantalum precursor therein, ozone may advantageously be employed as an oxic co-reactant therein. For some metals, volatile halide-containing species can also be used as a metal source.

The above-described method can be carried out to produce high dielectric constant, low leakage current non-crystalline metal oxide having a dielectric constant in a range of from 40 to 75, and/or a leakage current in a range of from $10^{-6}$ $A/cm^2$ to $10^{-9}$ $A/cm^2$ at 0.6 nm or lower equivalent oxide thickness.

The high dielectric constant, low leakage current non-crystalline metal oxide produced by the above-describe method, or otherwise in the broad practice of the present disclosure, can be further processed for subsequent operation, by post-deposition processes such as annealing. Annealing, when employed, can be carried out at suitable temperature, preferably below crystallization temperature of the metal oxide. In various embodiments, it is preferred to anneal the non-crystalline high k dielectric in an oxidizing ambient to stabilize the properties for further processing. Subsequent thermal processing can include deposition of a top electrode followed by interconnection processes.

The method described above may be carried out with the deposition of the metal oxide being performed on a titanium nitride surface, e.g., of a titanium nitride bottom electrode of a microelectronic device structure, wherein, after depositing metal oxide on the titanium nitride surface of the titanium nitride bottom electrode, a top electrode is deposited on the metal oxide, e.g., iridium oxide or other suitable top electrode material.

In various embodiments, the ALD method of the present disclosure is employed to form a bismuth tantalate (BiTaO) material having high dielectric constant (k) value, e.g., from 40 up to 75 or more, and low current leakage character, as for example current leakage density in a range of from $10^{-6}$ $A/cm^2$ to $10^{-9}$ $A/cm^2$ at 0.6 nm or lower equivalent oxide thickness.

Films of such composition may be formed by bismuth doping of a tantalum oxide thin film using ALD, to produce BiTaO films of the desired high dielectric constant and low current leakage character. The BiTaO film produced by such method is non-crystalline, and therefore lacks the leakage as it would otherwise be associated with grain boundaries and other extended defects in crystalline films. The use of ALD to produce the BiTaO films of the present disclosure enables the fabrication of high aspect ratio structures, such as those currently employed in dynamic random access memory (DRAM) metal-insulator-metal (MIM) structures, to be conformally coated with a uniform layer of the dielectric material.

Among various bismuth precursors that may be used to form high dielectric constant, low leakage current bismuth-containing metal oxides in accordance with the present disclosure, bismuth compounds of the following Classes I, II, and III have been found to exhibit desirable vaporization characteristics and thermal stability:

Class I

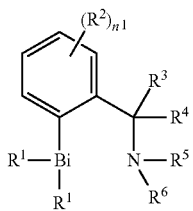

wherein $R^1$ represents a lower alkyl group; $R^2$ represents a lower alkyl group, a lower alkoxy group, a lower acyl group, a lower alkoxycarbonyl group, a lower halogenated alkyl group, or a halogen; $n^1$ represents the number of the substituent $R^2$ in the range of 0-4; and $R^3$ to $R^6$ each represents hydrogen, a lower alkyl group, or a lower halogenated alkyl group;

Class II

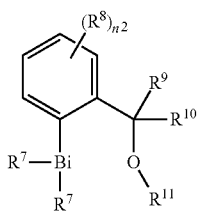

wherein $R^7$ represents a lower alkyl group; $R^8$ represents a lower alkyl group, a lower alkoxy group, a lower acyl group, a lower alkoxycarbonyl group, a lower halogenated alkyl group, or a halogen; $n^2$ represents the number of the substituent $R^8$ in the range of 0-4; and $R^9$ to $R^{11}$ each represents hydrogen, a lower alkyl group, or a lower halogenated alkyl group; and Class III

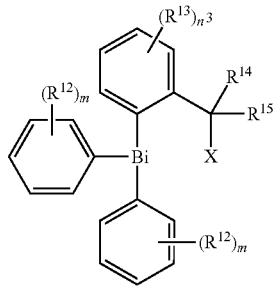

wherein $R^{12}$ and $R^{13}$ each represents a lower alkyl group, a lower alkoxy group, a lower acyl group, a lower alkoxycarbonyl group, a lower halogenated alkyl group, or a halogen; m represents the number of the substituent $R^{12}$ in the range of 0-5; $n^3$ represents the number of the substituent $R^{13}$ in the range of 0-4; $R^{14}$ and $R^{15}$ each represents hydrogen, a lower alkyl group, or a lower halogenated alkyl group; and X represents a substituent represented by the following formula 10 or 11:

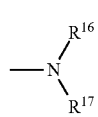 (10)

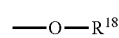 (11)

wherein $R^{16}$ to $R^{18}$ each represents hydrogen, a lower alkyl group, or a lower halogenated alkyl group.

Precursors of Class I can be formed by reaction of a monoaryl dihalogenated bismuth compound of the formula

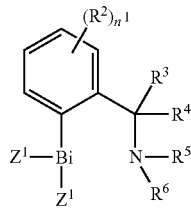

wherein $R^2$, $n^1$, and $R^3$ to $R^6$ are the same as defined above; and $Z^1$ represents a halogen, with an $R^1$— converting reagent, wherein $R^1$ is the same as defined above.

Precursors of Class I can also be synthesized by reacting a dialkyl monohalogenated bismuth compound of the formula

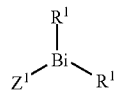

wherein $R^1$ and $Z^1$ are the same as defined above, with an arylating reagent represented by the following formula:

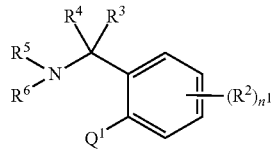

wherein $R^2$, $n^1$, and $R^3$ to $R^6$ are the same as defined above; and $Q^1$ represents any of lithium, sodium, potassium, MgCl, MgBr, or MgI.

Precursors of Class II can be formed by reaction of a monoaryl dihalogenated bismuth compound of the formula

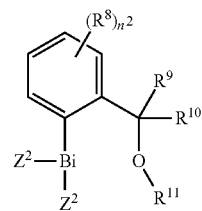

wherein $R^8$, $n^2$, and $R^9$ to $R^{11}$ are the same as defined above; and $Z^2$ represents a halogen, with an $R^7$— converting reagent, wherein $R^7$ is the same as defined above.

Precursors of Class II can also be formed by reaction of a dialkyl monohalogenated bismuth compound of the formula

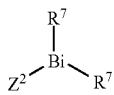

wherein $R^7$ and $Z^2$ are the same as defined above, with an arylating reagent of the formula

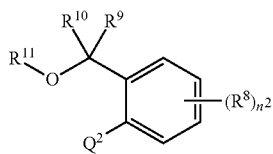

wherein $R^8$, $n^2$, and $R^9$ to $R^{11}$ are the same as defined above; and $Q^2$ represents any of lithium, sodium, potassium, MgCl, MgBr, or MgI.

Precursors of Class III can be formed by reacting a diaryl monohalogenated bismuth compound of the following formula

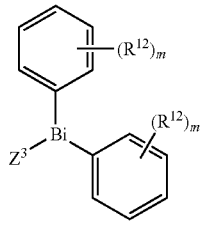

wherein $R^{12}$ and m are the same as defined above; and $Z^3$ represents a halogen, with an arylating reagent of the following formula

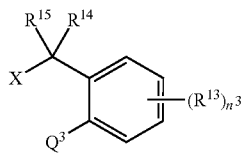

wherein $R^{13}$, $R^{14}$, $R^{15}$, $n^3$, and X are the same as defined above; and $Q^3$ represents an alkali metal, MgCl, MgBr, or MgI.

Illustrative bismuth compounds of the foregoing Classes I-III include:
diisopropyl(2-(N,N-diethylaminomethyl)-4-propylphenyl) bismuth,
dimethyl(2-(N,N-dimethylaminomethyl)-4-methoxyphenyl) bismuth,
diisopropyl(2-(N,N-diethylaminomethyl)-4-methoxyphenyl)bismuth,
dimethyl(2-methoxymethyl-4-propylphenyl)bismuth,
diisopropyl(2-methoxymethyl-4-propylphenyl)bismuth,
dimethyl(2-methoxymethyl-4-methoxyphenyl)bismuth,
diisopropyl(2-methoxymethyl-4-methoxyphenyl)bismuth,
dimethyl(2-(N-ethyl-N-methylaminomethyl)phenyl)bismuth,
dimethyl(2-(N,N-diethylaminomethyl)phenyl)bismuth,
dimethyl(2-(1-(N,N-dimethylamino)ethyl)phenyl)bismuth,
dimethyl(2-(1-(N,N-diethylamino)ethyl)phenyl)bismuth,
dimethyl(2-(1-(N,N-dimethylamino)-1-methylethyl)phenyl) bismuth,
dimethyl(2-(1-(N,N-diethylamino)-1-methylethyl)phenyl) bismuth,
dimethyl(2-(N,N-dimethylaminomethyl)-3-tolyl)bismuth,
dimethyl(2-(N,N-dimethylaminomethyl)-4-tolyl)bismuth,
dimethyl(2-(N,N-dimethylaminomethyl)-5-tolyl)bismuth,
dimethyl(2-(N,N-dimethylaminomethyl)-6-tolyl)bismuth,
dimethyl(2-(1-ethoxyethyl)phenyl)bismuth,
dimethyl(2-(1-methoxy-1-methylethyl)phenyl)bismuth,
dimethyl(2-methoxymethyl-3-tolyl)bismuth,
dimethyl(2-methoxymethyl-4-tolyl)bismuth,
dimethyl(2-methoxymethyl-5-tolyl)bismuth,
dimethyl(2-methoxymethyl-6-tolyl)bismuth,
dimethyl(2-ethoxymethyl-3-tolyl)bismuth,
dimethyl(2-ethoxymethyl-4-tolyl)bismuth,
dimethyl(2-ethoxymethyl-5-tolyl)bismuth,
dimethyl(2-ethoxymethyl-6-tolyl)bismuth,
di(4-propylphenyl)(2-(N,N-dimethylaminomethyl)-4-propylphenyl)bismuth,
di(4-acetylphenyl)(2-(N,N-dimethylaminomethyl)-4-propylphenyl)bismuth,
di(4-propylphenyl)(2-methoxymethyl-4-propylphenyl)bismuth,
di(4-acetylphenyl)(2-methoxymethyl-4-propylphenyl)bismuth,
di(2-tolyl)(2-(N,N-dimethylaminomethyl)phenyl)bismuth,
di(3-tolyl)(2-(N,N-dimethylaminomethyl)phenyl)bismuth,
diphenyl(2-(N,N-dimethylaminomethyl)-4-methylphenyl) bismuth,
di(2-tolyl)(2-(N,N-dimethylaminomethyl)-4-methylphenyl) bismuth,
di(3-tolyl)(2-(N,N-dimethylaminomethyl)-4-methylphenyl) bismuth,
di(4-tolyl)(2-(N,N-dimethylaminomethyl)-4-methylphenyl) bismuth,
di(2-ethylphenyl)(2-(N,N-dimethylaminomethyl)-4-methylphenyl)bismuth,
di(3-ethylphenyl)(2-(N,N-dimethylaminomethyl)-4-methylphenyl)bismuth,
di(4-ethylphenyl)(2-(N,N-dimethylaminomethyl)-4-methylphenyl)bismuth,
diphenyl(2-(N,N-diethylaminomethyl)phenyl)bismuth,
di(2-tolyl)(2-(N,N-diethylaminomethyl)phenyl)bismuth,
di(3-tolyl)(2-(N,N-diethylaminomethyl)phenyl)bismuth,
di(4-tolyl)(2-(N,N-diethylaminomethyl)phenyl)bismuth,
diphenyl(2-(N,N-diethylaminomethyl)-4-methylphenyl)bismuth,
di(2-tolyl)(2-(N,N-diethylaminomethyl)-4-methylphenyl) bismuth,
di(3-tolyl)(2-(N,N-diethylaminomethyl)-4-methylphenyl) bismuth,
di(4-tolyl)(2-(N,N-diethylaminomethyl)-4-methylphenyl) bismuth,
di(2-ethylphenyl)(2-(N,N-diethylaminomethyl)-4-methylphenyl)bismuth,
di(3-ethylphenyl)(2-(N,N-diethylaminomethyl)-4-methylphenyl)bismuth,
di(4-ethylphenyl)(2-(N,N-diethylaminomethyl)-4-methylphenyl)bismuth, diphenyl(2-(N-ethyl-N-methylaminomethyl)phenyl)bismuth,
di(2-tolyl)(2-N-ethyl-N-methylaminomethyl)phenyl)bismuth,
di(3-tolyl)(2-N-ethyl-N-methylaminomethyl)phenyl)bismuth,
di(4-tolyl)(2-N-ethyl-N-methylaminomethyl)phenyl)bismuth,
diphenyl(2-(N-ethyl-N-methylaminomethyl)-4-methylphenyl)bismuth,
di(2-tolyl)(2-(N-ethyl-N-methylaminomethyl)-4-methylphenyl)bismuth,
di(3-tolyl)(2-(N-ethyl-N-methylaminomethyl)-4-methylphenyl)bismuth,
di(4-tolyl)(2-(N-ethyl-N-methylaminomethyl)-4-methylphenyl)bismuth,
di(2-ethylphenyl)(2-(N-ethyl-N-methylaminomethyl)-4-methylphenyl)bismuth,
di(3-ethylphenyl)(2-(N-ethyl-N-methylaminomethyl)-4-methylphenyl)bismuth,
di(4-ethylphenyl)(2-(N-ethyl-N-methylaminomethyl)-4-methylphenyl)bismuth,
diphenyl(2-(methoxymethyl)phenyl)bismuth,
di(2-tolyl)(2-(methoxymethyl)phenyl)bismuth,
di(3-tolyl)(2-(methoxymethyl)phenyl)bismuth,
di(4-tolyl)(2-(Methoxymethyl)phenyl)bismuth,
di(2-ethylphenyl)(2-(methoxymethyl)phenyl)bismuth,
di(3-ethylphenyl)(2-(methoxymethyl)phenyl)bismuth,
di(4-ethylphenyl)(2-(methoxymethyl)phenyl)bismuth,
diphenyl(2-(methoxymethyl)-4-methylphenyl)bismuth,
di(2-tolyl)(2-(methoxymethyl)-4-methylphenyl)bismuth,
di(3-tolyl)(2-(methoxymethyl)-4-methylphenyl)bismuth,
di(4-tolyl)(2-(methoxymethyl)-4-methylphenyl)bismuth,
di(2-ethylphenyl)(2-(methoxymethyl)-4-methylphenyl)bismuth,
di(3-ethylphenyl)(2-(methoxymethyl)-4-methylphenyl)bismuth,
di(4-ethylphenyl)(2-(methoxymethyl)-4-methylphenyl)bismuth,
diphenyl(2-(ethoxymethyl)phenyl)bismuth,
di(2-tolyl)(2-(ethoxymethyl)phenyl)bismuth,
di(3-tolyl)(2-(ethoxymethyl)phenyl)bismuth,
di(4-tolyl)(2-(ethoxymethyl)phenyl)bismuth,
di(2-ethylphenyl)(2-(ethoxymethyl)phenyl)bismuth,
di(3-ethylphenyl)(2-(ethoxymethyl)phenyl)bismuth,
di(4-ethylphenyl)(2-(ethoxymethyl)phenyl)bismuth,
diphenyl(2-(ethoxymethyl)-4-methylphenyl)bismuth,
di(2-tolyl)(2-(ethoxymethyl)-4-methylphenyl)bismuth,
di(3-tolyl)(2-(ethoxymethyl)-4-methylphenyl)bismuth,
di(4-tolyl)(2-(ethoxymethyl)-4-methylphenyl)bismuth,
di(2-ethylphenyl)(2-(ethoxymethyl)-4-methylphenyl)bismuth,
di(3-ethylphenyl)(2-(ethoxymethyl)-4-methylphenyl)bismuth, and
di(4-ethylphenyl)(2-(ethoxymethyl)-4-methylphenyl)bismuth.

Although the disclosure herein is primarily directed to formation of BiTaO materials and films, the disclosure more broadly contemplates high dielectric constant, low current leakage oxides of two or more compatible metals. Examples of specific dielectric material compositions include, without limitation, BiTaO, LnTaO, LnTiO, (Ba,Sr) tetratitanates, and ZrTiSnO, wherein Ln is a lanthanide series element, e.g., lanthanum, cerium, neodymium, terbium, gadolinium, erbium, or ytterbium. In the aforementioned chemical formulae, atomic or molar subscripts have not been set out, in order to provide a generalized nomenclature, in recognition that the particular atomic proportions of the constituent elements may vary, within potential compositional forms of such metal oxides.

The films of the present disclosure may be formed by atomic layer deposition of respective metals, utilizing any suitable oxic co-reactant (oxygen, ozone, etc.), and involving formation of an oxide film of a first one of the multiple metals, followed by reaction in a subsequent ALD step with the other dopant metal(s) species. The ALD process may be carried out at suitable process conditions appropriate to the metals involved. The respective metals of the high k, low current leakage oxide films may be derived from a variety of suitable organometallic precursors, including organo moieties that may comprise aliphatic and/or aromatic components, comprising hydrocarbonaceous moieties per se as well as hydrocarbonaceous moieties further comprising heteroatoms and heteroatomic organic moieties. Suitable precursors for specific metal components may be readily determined within the skill of the art, based on the disclosure herein, for a given high k, low current leakage oxide film.

The substrate on which the high k, low current leakage film material is deposited by ALD may be of any suitable type, and may for example include titanium nitride, tantalum nitride, titanium aluminum nitride, iridium, ruthenium and ruthenium-based surfaces or device elements.

By way of specific example, BiTaO films of high k, low current leakage character can be prepared using triphenylbismuth and tris(diethylamino)(tert-butylimido)tantalum, [Ta=N-t-butyl(NEt$_2$)$_3$], denoted TBTDETa, in an ALD process conducted at 300° C. using ozone as a co-reactant, to produce a BiTaO film having a high dielectric constant and a leakage current of about 6×10$^{-7}$ A/cm$^2$ at 0.6 nm equivalent oxide thickness (EOT), using iridium oxide (IrO$_2$) top electrodes and titanium nitride (TiN) bottom electrodes. Dielectric films produced by such process can be further improved in performance by annealing at temperature below crystallization temperature (~750° C.).

The annealing can be carried out for appropriate time providing the desired ultimate characteristics, and a suitable annealing operation may for example have a duration of from a few milliseconds up to 1 hour or more. The ambient environment of the dielectric film in the annealing operation may be widely varied, and may for example include atmospheres ranging from inert gas environments (utilizing a nitrogen or argon ambient) to ambient atmospheres including some amount of oxygen and/or water. In some embodiments, it is preferred to anneal the non-crystalline high k, low current leakage dielectric film in an oxidizing ambient to stabilize its properties for subsequent processing.

In various embodiments, the high k, low current leakage film material is formed as a non-crystalline ALD film having a dielectric constant greater than 50, which is processed by thermal treatment in an oxidizing environment prior to additional thermal treatments to form the final high k, low current leakage film. The oxidizing environment may include an ambient gas environment of from 0.1% to 100% of O$_2$ or N$_2$O, or from 0.1 to 30% O$_3$, wherein such percentages are volume percentages of the total gas volume. The thermal treatment in an oxidizing environment can be carried out for any suitable period of time providing the desired film properties. In some embodiments, such thermal treatment is carried out for a period of from 1 to 1000 seconds. The temperature of the thermal treatment in an oxidizing environment can be conducted at any appropriate temperature, e.g., a temperature that is above the ALD deposition temperature and less than the crystallization temperature of the film material. In some embodiments, the temperature of the thermal treatment in an oxidizing environment is in a range of from 375° C. to 575° C. In other embodiments, the temperature of the thermal treatment in an oxidizing environment is in a range of from 440° C. to 520° C.

Non-crystalline high k, low leakage films of the present disclosure exhibit high dielectric constant and low leakage properties in very thin films, e.g., a BiTaO film having an EOT of 0.3 or 0.4 nm. To ensure that such films retain a robust character under subsequent semiconductor processing conditions such as elevated temperature and a range of oxidizing to reducing conditions, it is desirable to stabilize the film with annealing in an oxidizing ambient before other thermal treatment.

In the absence of such oxidizing stabilization, the film may be susceptible to loss of its low leakage character under exposure to nitrogen at temperatures higher than 400° C., such as rapid thermal nitridation (RTN) annealing at these temperatures, or in the formation of a top electrode of titanium nitride (TiN) involving use of ammonia ($NH_3$) or other nitrogen-containing source gas. Oxidizing stabilization therefore is desirable to improve the robustness of the noncrystalline film with respect to subsequent processing.

The high k, low current leakage films of the present disclosure may be usefully employed as a dielectric material in DRAM capacitor or other microelectronic device applications. The films of the disclosure may also be employed as gate dielectric material films in applications where hafnium oxide ($HfO_2$) is conventionally employed, to afford lower EOT with low current leakage in such applications, utilizing gate metal materials such as titanium nitride or tantalum nitride.

In various specific applications, the high dielectric constant, low leakage current non-crystalline metal oxide of the present disclosure is provided in a microelectronic device structure including a bottom electrode on which the high dielectric constant, low leakage current non-crystalline metal oxide is deposited, and a top electrode formed on the high dielectric constant, low leakage current non-crystalline metal oxide.

In such microelectronic device structure, the top and bottom electrodes may be formed of any suitable material. In some embodiments, at least one of the top and bottom electrodes comprises a conductive metal nitride, e.g., titanium nitride, or tantalum nitride. In other applications and embodiments, at least one of the top and bottom electrodes may comprise a conductive metal or metal oxide, such as material selected from the group consisting of $MoO_2$, $Ni_2O_3$, $RuO_2$, $IrO_2$, Al, Mo, Ru and Ir.

The high dielectric constant, low leakage current non-crystalline metal oxide of the present disclosure may be utilized in a wide variety of microelectronic devices, including, without limitation, memory devices and logic devices.

FIG. 1 is a schematic representation of a generalized high dielectric constant capacitor including a high k, low current leakage material of the present disclosure.

As illustrated in FIG. 1, the high k capacitor comprises a metal oxide layer 2 of high dielectric constant, low current leakage character, e.g., a BiTaO film having a dielectric constant k of 60, and a current leakage of $5 \times 10^{-7}$ $A/cm^2$ at 0.6 nm EOT. Two conductive barrier layers 3 and 4 are in direct contact with such metal oxide layer 2. Cu or Al electrode layers 6 and 7 overlay such conductive barrier layers 3 and 4 on their respective outer surfaces.

Such capacitor may be incorporated in a large integrated circuit or other electronic device. The capacitor can for example be placed on a semiconductor substrate having vias and plugs therein (not shown).

It is to be appreciated that the capacitor in FIG. 1 is illustratively depicted as a generalization of various capacitor structures, for ease of understanding. In commercial embodiments, the capacitor can be substantially planar with multiple layers of electrodes and dielectric materials. The capacitor can take the form of stack capacitors or trench capacitors with high aspect ratios, wherein the sides of the electrodes contribute substantially to the total surface area of the electrodes in contact with the high dielectric constant metal oxide. The capacitor can also take various other forms and conformations, as readily determinable by a person of ordinary skill in the art.

Figure 2:
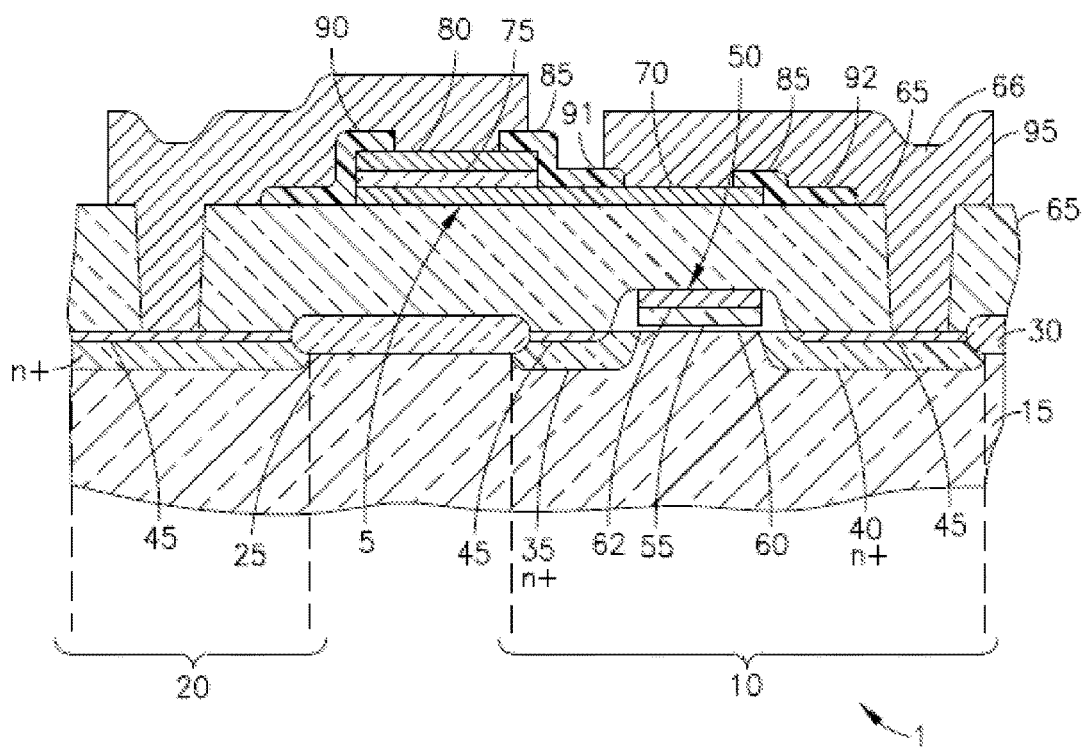
FIG. 2 is a schematic representation of a portion of an integrated circuit with an integrated capacitor according to one embodiment of the disclosure.

For example, FIG. 2 is a schematic representation of a portion of an integrated circuit with an integrated capacitor according to one embodiment of the disclosure.

The illustrated portion of integrated circuit 1 includes a first active device 10, such as a conventional metal-oxide-semiconductor field effect transistor (MOSFET), and a capacitor 5 employing a high k, low current leakage dielectric film layer of BiTaO formed on a substrate 15, such as a silicon substrate. A drain region of a second transistor 20 is also shown. The particular types of active devices employed, e.g., NMOS, PMOS or CMOS, are based on the desired operation of the integrated circuit and are not critical for achieving the benefits of the present disclosure. Other suitable active devices include, for example, bipolar junction transistors and GaAs MESFETs. The transistors 10 and 20 can be fabricated, for example, by conventional processing methods. In FIG. 2, the transistors 10 and 20 include field oxide regions 25 and 30 that are formed, for example, by $SiO_2$ and operate as insulators between the transistor 10 and adjacent devices, such as the transistor 20. Source and drain regions 35 and 40 of the transistor 10 are formed by doping with n-type impurities, such as arsenic or phosphorous for NMOS. An optional layer of silicide 45 is deposited over the source and drain regions 35 and 40 to reduce the source and drain resistance, which enables greater current delivery by the transistor 10.

A gate 50 of the transistor includes, for example, polysilicon 55 doped with an n-type impurity, such as by an implant or vapor doping. An optional layer of silicide 62 is also deposited over the gate polysilicon 55 to reduce the electrical resistance of the gate 50. An insulating layer 65 of, for example, P-glass which is an oxide doped with phosphorous is then deposited on the transistors 10 and 20 to provide protection to the transistors 10 and 20 and to facilitate electrical connection. Contact windows 66 are then etched in the insulating layer 65 to expose the device gate 50 and source and drain regions, such as the regions 35 and 40. Although only the drain regions of the transistors 10 and 20 are exposed in the cross-section of the integrated circuit illustrated in FIG. 2, it should be readily understood that the gate and source are exposed at other areas of the integrated circuit 1 that are outside the illustrated cross-section.

At least one capacitor, such as the capacitor 5, is formed on the integrated circuit, such as on the insulating layer surface. The capacitor 5 includes a first electrode 70 formed on the insulating layer surface, a dielectric thin film region 75 on the first electrode 70, and a second electrode 80 formed on the dielectric film region 75 opposite the first electrode 70. The dielectric thin film region 75 comprises a high k, low current leakage metal oxide film in accordance with the present disclosure.

It is possible for the first electrode 70 to have a two layer structure. Such a structure may comprise, for example, a layer of platinum formed over a layer of Ti-nitride. Platinum is a suitable electrode material, however, it adversely chemically reacts with silicon. As a consequence, a diffusion barrier may be employed as the second electrode layer which is in contact with the insulating layer surface to substantially prevent a chemical reaction between the platinum and the silicon of the substrate 15.

Suitable thicknesses for each layer of the two-layer structure may be in a range of from 0.005 to 0.5 µm. Thicknesses less than 0.005 µm may be undesirable in some applications because of high electrical resistance while thicknesses greater than 0.5 µm are generally disadvantageous because of high fabrication cost and poor adherence. The first electrode 70 may be larger than the second electrode 80 in order to provide electrical connection to the first electrode 70.

After formation of the capacitor 5, an insulating material 85, such as, for example, $SiO_2$ is deposited on edge regions 90, 91 and 92 of the capacitor 5 to prevent short circuits between the first and second capacitor electrodes 70 and 80 when the interconnection layer is formed. An interconnection layer 95 then is formed on the insulation layer and corresponding etched contact windows to electrically connect the devices 10 and 20 and the capacitor 5 in a desired manner. Suitable materials for the interconnection layer 95 include aluminum and copper. In the integrated circuit 1, the drain 40 of the transistor 10 is electrically connected to the first electrode 70 of the capacitor 80 and the capacitor's second electrode 80 is electrically connected to the source of the transistor 20. As an alternative to the structure shown in FIG. 2, other integrated circuitry device structures may be utilized, such as the DRAM device structures disclosed in U.S. Pat. No. 7,829,410 and U.S. Pat. No. 7,271,051.

Figure 3:
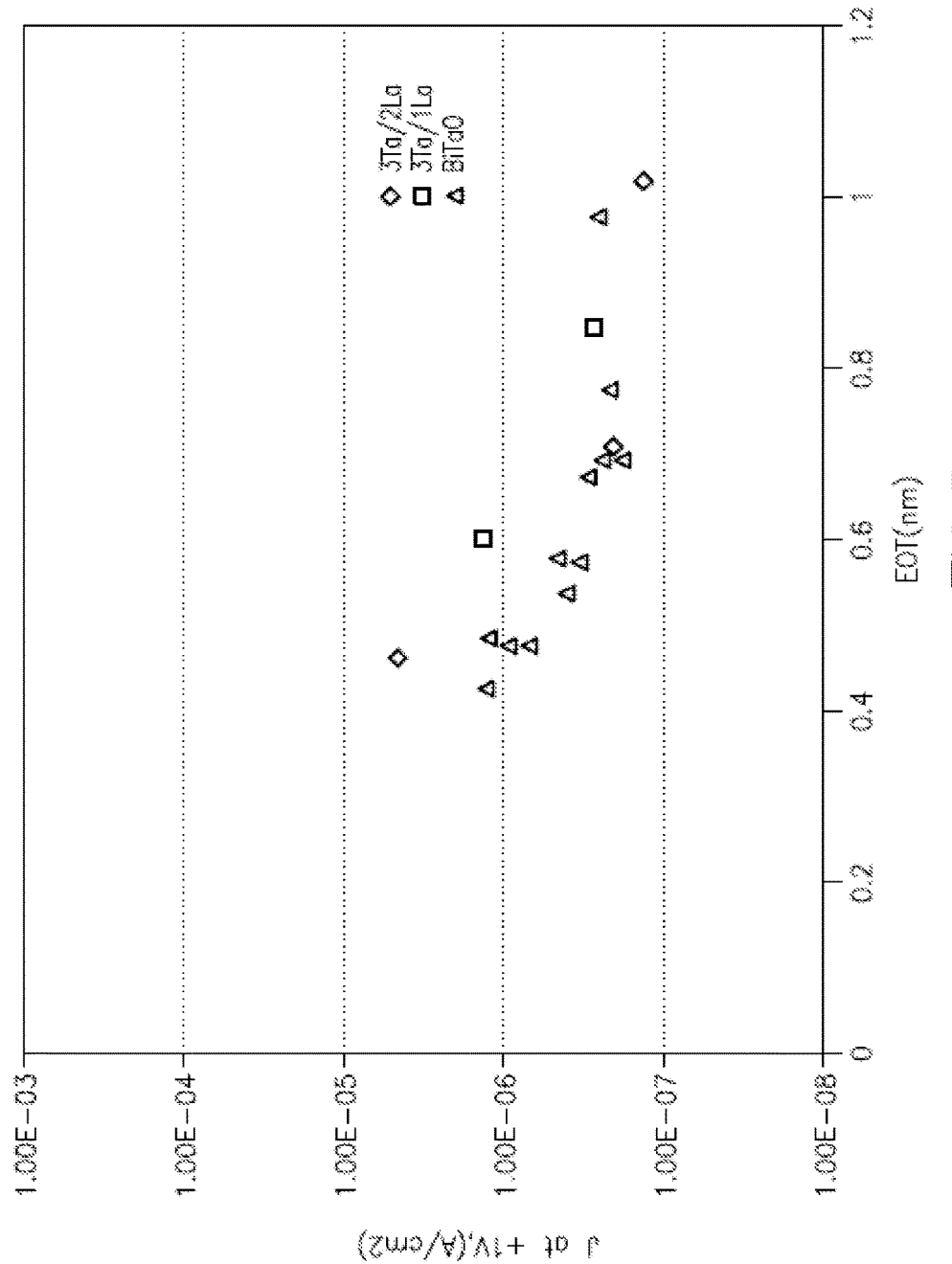
FIG. 3 is a graph of current density, J, in amperes per square centimeter ($A/cm^2$) at voltage of +1 v, as a function of equivalent oxide thickness, in nanometers, for 3Ta/2La, 3Ta/1La, and BiTaO films, deposited by atomic layer deposition.

FIG. 3 is a graph of current density, J, in amperes per square centimeter ($A/cm^2$) at voltage of +1 v, as a function of equivalent oxide thickness, in nanometers, for 3Ta/2La, 3Ta/1La, and BiTaO films, deposited by atomic layer deposition.

The data shown in FIG. 3 demonstrate high dielectric constant for very thin films deposited by ALD.

In the use of ALD for forming mixed metal oxide on substrates in accordance with the present disclosure, a variety of pulse sequences may be employed in the ALD process. In various embodiments, so-called "burst" pulsing may be employed in which the purge gas is utilized as a booster medium to deliver precursor in a burst.

Figure 4:
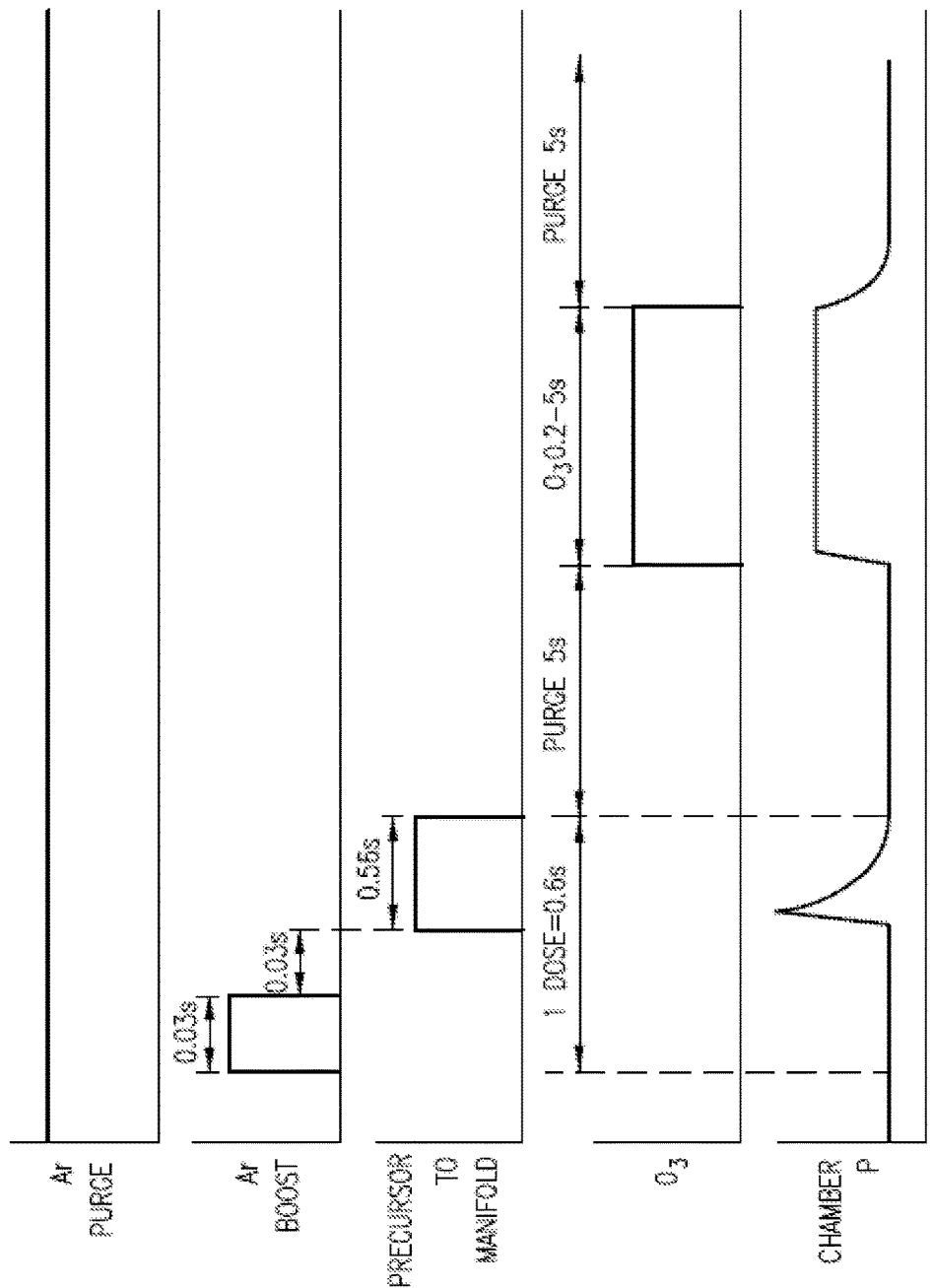
FIG. 4 is a cycle sequence diagram for a precursor burst cycle with single boost of the precursor dose by the purge gas, as usefully employed in the method of the present disclosure for deposition of mixed metal oxide on a substrate.

One such burst delivery cycle is shown in FIG. 4, which is a cycle sequence diagram for a precursor burst cycle with single boost of the precursor dose by the purge gas, as usefully employed in the method of the present disclosure for deposition of mixed metal oxide on a substrate.

In this cycle, a constant flow of purge gas, e.g., argon, is split between ALD valves with orifices in the atomic layer delivery manifold to ensure uniform purging. An open stop valve in the flow circuitry accommodates a purging pressure that may for example be on the order of 200-300 millitorr. A boost pulse of the purge gas is flowed to the precursor ampoule, so that precursor is delivered to the ALD manifold in a burst, with oxygen being metered to the manifold by an orifice.

Figure 5:
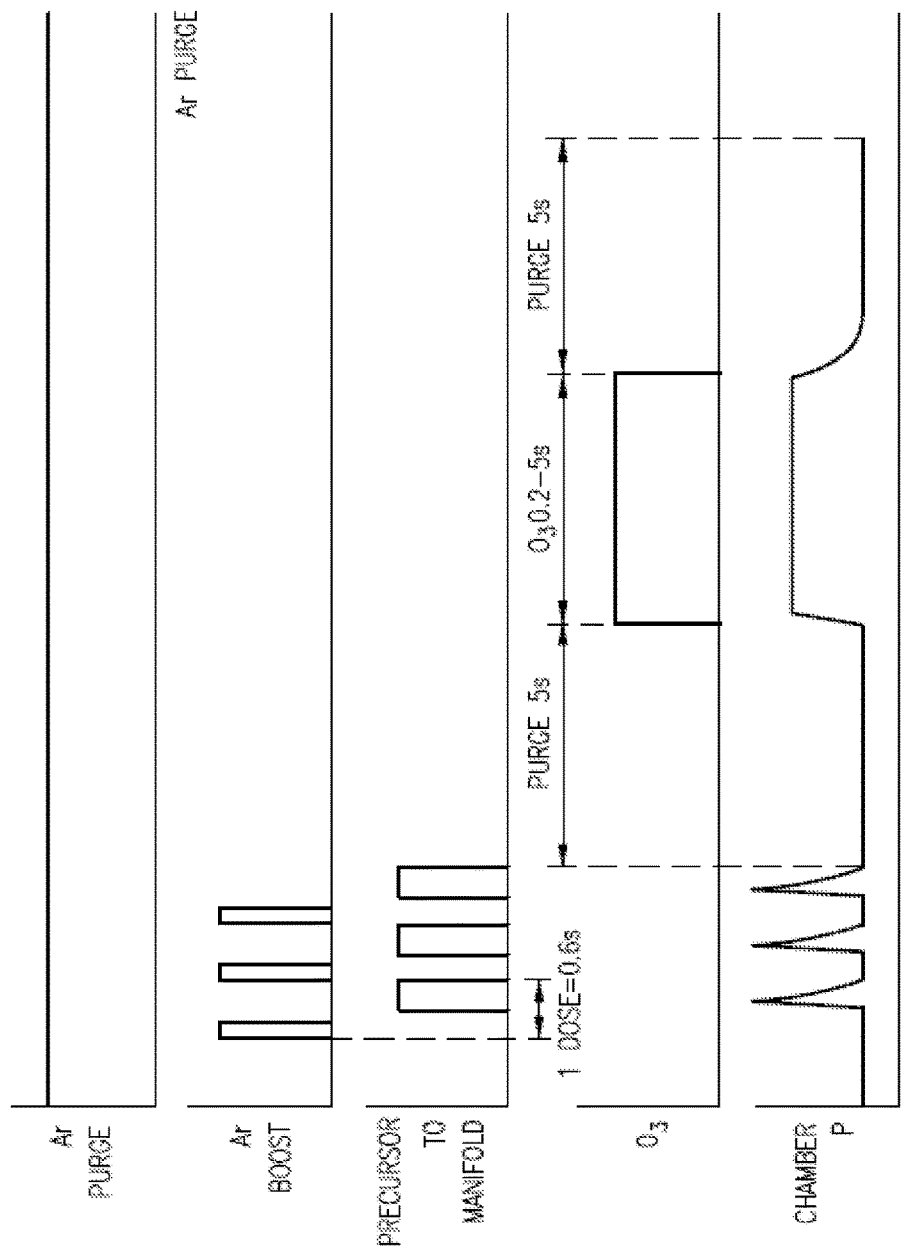
FIG. 5 is a cycle sequence diagram for a precursor pulse sequence including three boost doses of the precursor with purge gas, according to another embodiment of the disclosure.

In the cycle diagram, pressures are shown as a function of time, for the argon purge, the argon boost, the precursor flowed to the ALD manifold, the ozone oxidant, and the. ALD chamber pressure FIG. 5 is a cycle sequence diagram for a precursor pulse sequence including three boost doses of the precursor with purge gas, according to another embodiment of the disclosure. In this sequence, multiple doses of the precursor sequentially saturate the surface of the wafer. In the cycle diagram, pressures are shown as a function of time, for the argon purge, the argon boost, the precursor flowed to the ALD manifold, the ozone oxidant, and the. ALD chamber pressure.

Figure 6:
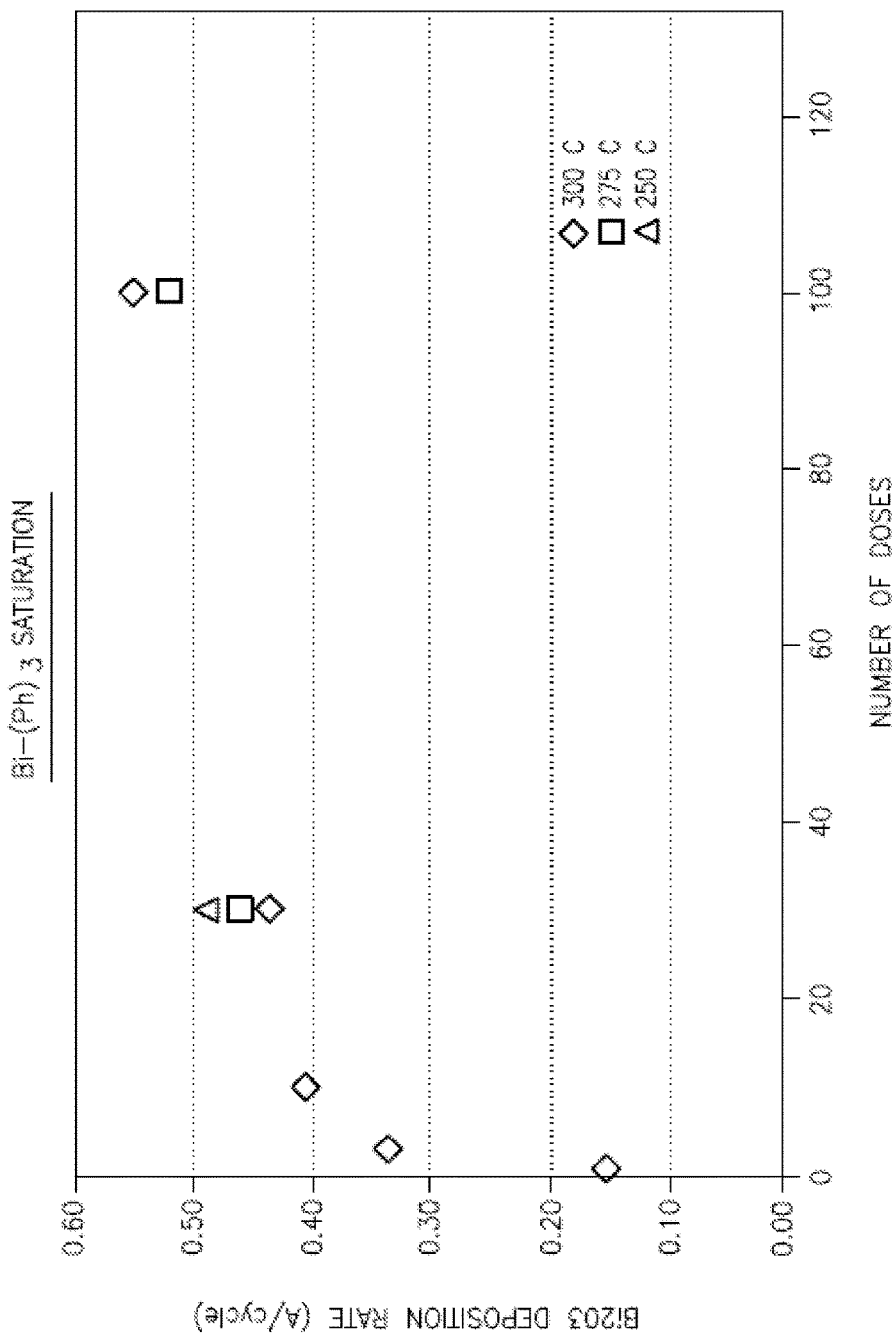
FIG. 6 is a graph of bismuth oxide deposition rate, in Angstroms per cycle, as a function of the number of doses, using triphenylbismuth as the bismuth precursor, in the deposition of a BiTaO material on a titanium nitride substrate.

FIG. 6 is a graph of bismuth oxide deposition rate, in Angstroms per cycle, as a function of the number of doses, using triphenylbismuth as the bismuth precursor, in the deposition of a BiTaO material on a titanium nitride substrate. The graph shows the saturation for the bismuth precursor, at temperature of 250° C., 275° C., and 300° C. Using the triphenylbismuth precursor, a cycle sequence including 3Bi/$O_3$ cycles: 1Ta/$O_3$ cycle yielded a composition of approximately 30% bismuth in the BiTaO film. The dose of the bismuth cycle was increased to measure saturation. Changes in deposition per bismuth cycle changed less than 10% from 30 to 100 doses at temperature below 275° C.

It has been found that the duration of the oxidant pulse in the ALD process according to the present disclosure can have significant effect on carbon impurity levels in the product metal oxide.

This was demonstrated in an illustrative ALD process carried out to form BiTaO films using t-butyl-tridiethylaminotantalum (TBTDETa) as the tantalum precursor and triphenylbismuth as the bismuth precursor, in different cycle time sequences. A first run was carried out at 300° C. according to the following cycle: 0.2 seconds ozone for $Ta_2O_5$, 1.0 second ozone for $Bi_2O_3$, which resulted in 1% carbon in the BiTaO film. A second run was carried out at 300° C. according to the following cycle: 5 seconds ozone for $Ta_2O_5$, 5 second ozone for $Bi_2O_3$, which resulted in approximately 0.1% carbon in the BiTaO film. These results showed that increasing the ozone pulse time reduced the carbon impurity levels in the BiTaO film.

Saturation effects were also studied for the bismuth precursor Bi(OCMe2CH2OMe)$_3$, also known as Bi(mmp)$_3$, resulting in the determination that such bismuth precursor saturates on a titanium nitride substrate at 250° C. with dosages up to approximately 30 doses per cycle, but very high doses (~100 doses/cycle) using such precursor exhibit some instability. This was also true at temperature of 300°, but the bismuth oxide deposition rate was significantly higher at such temperature. From SIMS data, it was found that BiTaO films produced using Bi(mmp)$_3$ as the bismuth precursor exhibited 0.4% carbon in films formed at 275° C., and 0.7% carbon in films formed at 300° C.

Saturation effects were also studied for the bismuth precursor $(CH_3)_2Bi(C_6H_4)CH_2N(CH_3)_2$,

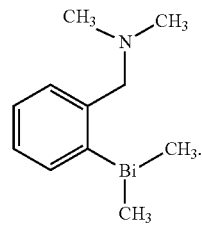

Figure 7:
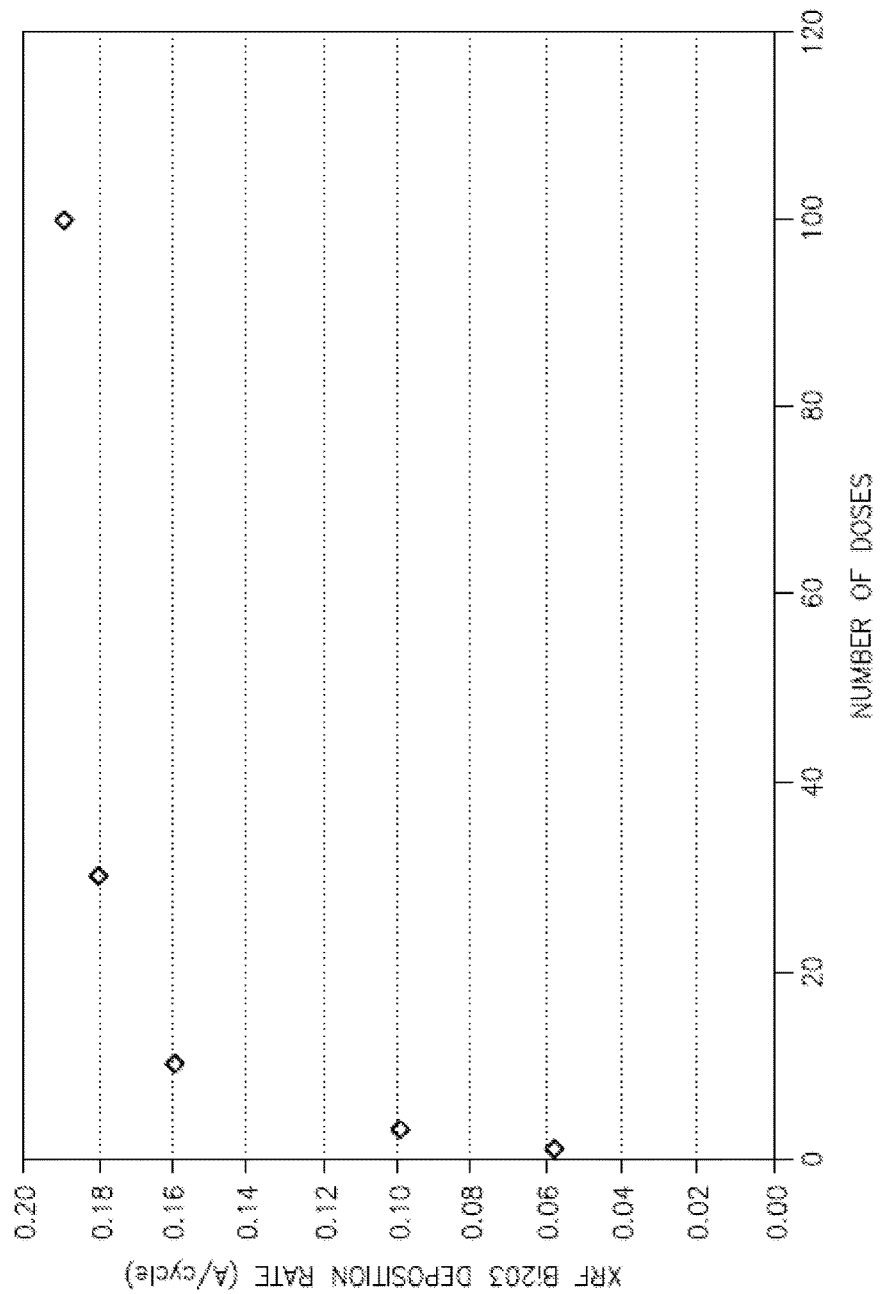
FIG. 7 is a graph of bismuth oxide deposition rate, in Angstroms per cycle, as a function of the number of doses, using $(CH_3)_2Bi(C_6H_4)CH_2N(CH_3)_2$ as the bismuth precursor, in the deposition of a BiTaO material on a titanium nitride substrate.

FIG. 7 is a graph of bismuth oxide deposition rate, in Angstroms per cycle, as a function of the number of doses, using $(CH_3)_2Bi(C_6H_4)CH_2N(CH_3)_2$ as the bismuth precursor, in the deposition of a BiTaO material on a titanium nitride substrate, showing saturation at 300° C., with a cycle including a one second ozone pulse, 3 $Bi_2O_3$ layers, providing a BiTaO film containing approximately 40 atomic percent bismuth. This precursor produced excellent saturation at 300° C.

From SIMS data, it was found that BiTaO films produced at 300° C. using $(CH_3)_2Bi(C_6H_4)CH_2N(CH_3)_2$ as the bismuth precursor, with a 5 second ozone pulse, contained 0.2% carbon, and with a one second ozone pulse, contained 0.5% carbon. Such precursor thus demonstrated capability for producing films with low carbon incorporation over a substantial range of oxidant pulse duration.

The features and advantages of the disclosure are more fully illustrated by the following example.

Example I

BiTaO was deposited on three coupons of TiN bottom electrode structure with 40 Bi cycles to 61 Ta cycles. A second run of 3 coupons was deposited with 44 Bi cycles to 67 Ta cycles. From each run, one coupon was given a top electrode of $IrO_2$ sputtered through a shadow mask; a second coupon was first given a 1 minute anneal in $N_2$ for rapid thermal nitridation (RTN) and then a top electrode; a third coupon was given a 1 minute anneal in $O_2$ for rapid thermal oxidation (RTO), then a 1 minute anneal in $N_2$, and then given a top electrode. Capacitance and leakage were measured on 30 capacitors of each coupon and representative capacitors were chosen. The data are summarized in Table 1 below. The capacitance of the as-deposited films was 0.41 or 0.42 nm and the leakage was $5\text{-}10\times10^{-7}$ $A/cm^2$ in both polarities. Coupons that received just the 400° C. RTN had high tan δ, so capacitance could not be determined accurately; the leakage was >1 $A/cm^2$. Coupons that received a 450° C. RTO prior to the 400° C. RTN maintained capacitance and leakage similar to the as-deposited films.

TABLE 1

| cycles Bi:Ta | as-deposited | | | 400° C. RTN | | | 450° C. RTO/400° C. RTN | | |
|---|---|---|---|---|---|---|---|---|---|
| | EOT (nm) | +J@+1 V (A/cm²) | -J@-1 V (A/cm²) | EOT (nm) | +J@+1 V (A/cm²) | -J@-1 V (A/cm²) | EOT (nm) | +J@+1 V (A/cm²) | -J@-1 V (A/cm²) |
| 40:61 | 0.41 | 5.74E-07 | 6.59E-07 | nd | 2.18E+00 | 1.72E+00 | 0.44 | 1.17E-06 | 3.84E-07 |
| 44:67 | 0.42 | 1.11E-06 | 6.57E-07 | nd | 2.42E+00 | 1.92E+00 | 0.49 | 6.33E-07 | 4.45E-07 | nd—not determined

Example II

It was determined that $BiTaO_x$ films are susceptible to high leakage behavior after rapid thermal nitridation (RTN) at temperature of 400° C. for 60 seconds. In the oxide composition formulae used herein, x may have any suitable stoichiometric value. The suitability of $BiTaO_x$ films for formation of TiN top electrodes (TE) thereon using $NH_3$ as a reactant gas, was therefore assessed using various processing approaches to enhance the robustness of the $BiTaO_x$ films to the TiN TE formation process. In this effort, resistance to RTN was used as a proxy for the TiN TE formation process, to determine the most effective film enhancement processing techniques.

Three approaches were evaluated: (i) formation of a tantalum oxide ($TaO_x$) cap over the $BiTaO_x$ film; (ii) formation of an aluminum oxide ($AlO_x$) cap over the $BiTaO_x$ film; and (iii) rapid thermal oxidation (RTO) stabilization of the $BiTaO_x$ film.

In this evaluation, the Bi:Ta cycle ratio was used to control film composition of the $BiTaO_x$ film. The number of ALD cycles was used to control thickness of the deposited $BiTaO_x$ film. 1 inch and 45 mm coupons were utilized, and BiTaO films were deposited on the film, with thickness of the film determined by x-ray fluorescence (XRF) technique. It should be noted that the XRF measures the Bi and Ta atoms/unit area and the reported thickness is calculated using the densities of fully dense crystalline $Bi_2O_3$ and $Ta_2O_5$ material. TEM analysis of these noncrystalline films indicates that the physical thickness of the films is 1.5 to 2× thickener than the values measured by XRF. One 45 mm coupon received an iridium oxide ($IrO_2$) top electrode in the as-deposited condition. One coupon of each condition received a 400° C. RTN treatment prior to the top electrode (TE) being deposited. Additional coupons received rapid thermal oxidation (RTO) treatment prior to RTN and TE formation.

Results of the evaluation are set out in Table 2 below.

TABLE 2

| run # | Bi:Ta | BiTaO thickness (XRF) | cycles | coupon 1" | coupon 45 mm |
|---|---|---|---|---|---|
| | | TaO cap | | | |
| P-165 | 5:4 | 20 | 0 | 1 | 2 |
| P-170 | 5:4 | 30 | 0 | 1 | 2 |
| P-166 | 5:4 | 40 | 0 | 1 | 2 |
| P-167 | 5:4 | 57 | 0 | 1 | 2 |
| P-168 | 5:4 | 57 | | | |
| P-169 | 5:4 | 40 | 10 | 1 | 4 |
| P-171 | 5:4 | 40 | 20 | 1 | 4 |
| P-172 | 5:4 | 40 | 40 | 1 | 4 |
| P-173 | 1:1 | | | | |
| P-174 | 1:1 | 30 | 0 | 1 | 2 |
| P-175 | 1:1 | 40 | 0 | 1 | 2 |
| P-179 | 1:1 | 50 | 0 | 1 | 2 |
| P-180 | 1:1 | 40 | 10 | 1 | 4 |
| P-181 | 1:1 | 40 | 20 | 1 | 4 |
| P-182 | 1:1 | 40 | 40 | 1 | 4 |
| P-183 | 4:5 | 30 | 0 | 1 | 2 |
| P-186 | 4:5 | 40 | 0 | 1 | 2 |
| P-184 | 4:5 | 50 | 0 | 1 | 2 |
| P-185 | 4:5 | 70 | 0 | 1 | 2 |
| P-187 | 4:5 | 40 | 10 | 1 | 4 |
| P-188 | 4:5 | 40 | 20 | 1 | 4 |
| P-189 | 4:5 | 40 | 40 | 1 | 4 |
| | | AlO cap | | | |
| P-202 | 5:4 | 20 | 0 | 1 | |
| P-213 | 3:2 | 30 | 0 | 1 | 3 |
| P-203 | 3:2 | 40 | 0 | 1 | 3 |

TABLE 2-continued

| run # | Bi:Ta | BiTaO thickness (XRF) | cycles | coupon 1" | 45 mm |
|---|---|---|---|---|---|
| P-222 | 3:2 | 50 | 0 | 1 | 3 |
| P-214 | 3:2 | 60 | 0 | 1 | 3 |
| P-218 | 3:2 | 40 | 5 | 1 | 4 |
| P-216 | 3:2 | 40 | 10 | 1 | 4 |
| P-215 | 3:2 | 40 | 20 | 1 | 4 |
| P-207 | 1:1 | 40 | 5 | 1 | 4 |
| P-208 | 1:1 | 40 | 10 | 1 | 4 |
| P-209 | 1:1 | 40 | 20 | 1 | 4 |
| P-223 | 1:2 | 20 | 0 | 1 | 3 |
| P-221 | 2:3 | 30 | 0 | 1 | 3 |
| P-220 | 2:3 | 40 | 0 | 1 | 3 |
| P-204 | 2:3 | 46 | 0 | 1 | 3 |
| P-219 | 2:3 | 50 | 0 | 1 | 3 |
| P-212 | 2:3 | 40 | 5 | 1 | 4 |
| P-211 | 2:3 | 40 | 10 | 1 | 4 |
| P-210 | 2:3 | 40 | 20 | 1 | 4 |

Figure 8:
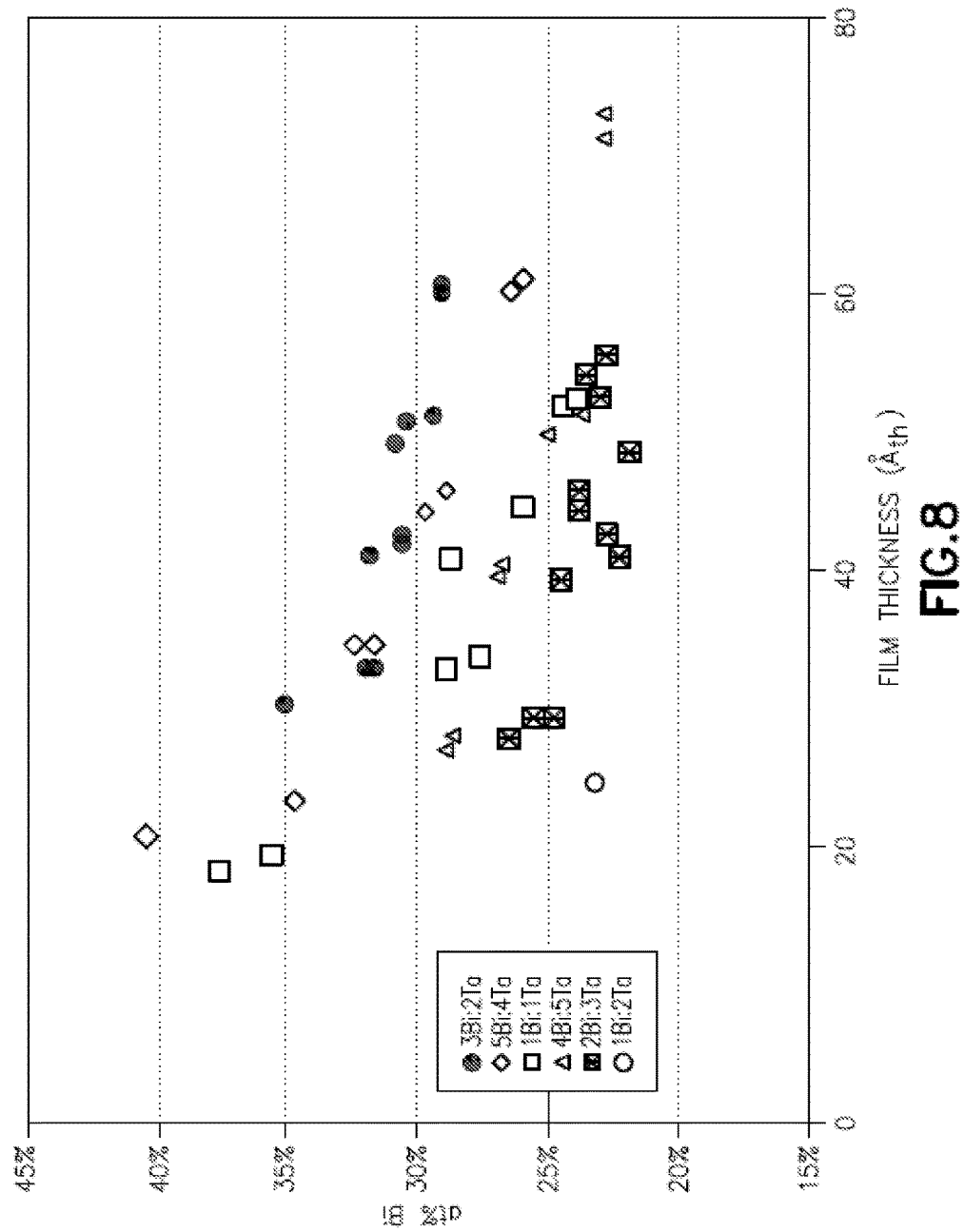
FIG. 8 is a graph of atomic % bismuth as a function of film thickness, in Angstroms, for different ratios of bismuth: tantalum, namely, 3Bi:2Ta, 5Bi:4Ta, 1Bi:1Ta, 4Bi:5Ta, 2Bi:3Ta, and 1Bi:2Ta, for films deposited in this evaluation, as baseline process response data.

FIG. 8 is a graph of atomic % bismuth as a function of film thickness, in Angstroms, for different ratios of bismuth:tantalum, namely, 3Bi:2Ta, 5Bi:4Ta, 1Bi:1Ta, 4Bi:5Ta, 2Bi:3Ta, and 1Bi:2Ta, for films deposited in this evaluation, as baseline process response data.

It was determined that a 3:2 ratio of Bi:Ta did not substantially increase bismuth content at thicknesses below 50 Å, and that a 2:3 ratio was successful at thicknesses below 50 Å.

Figure 9:
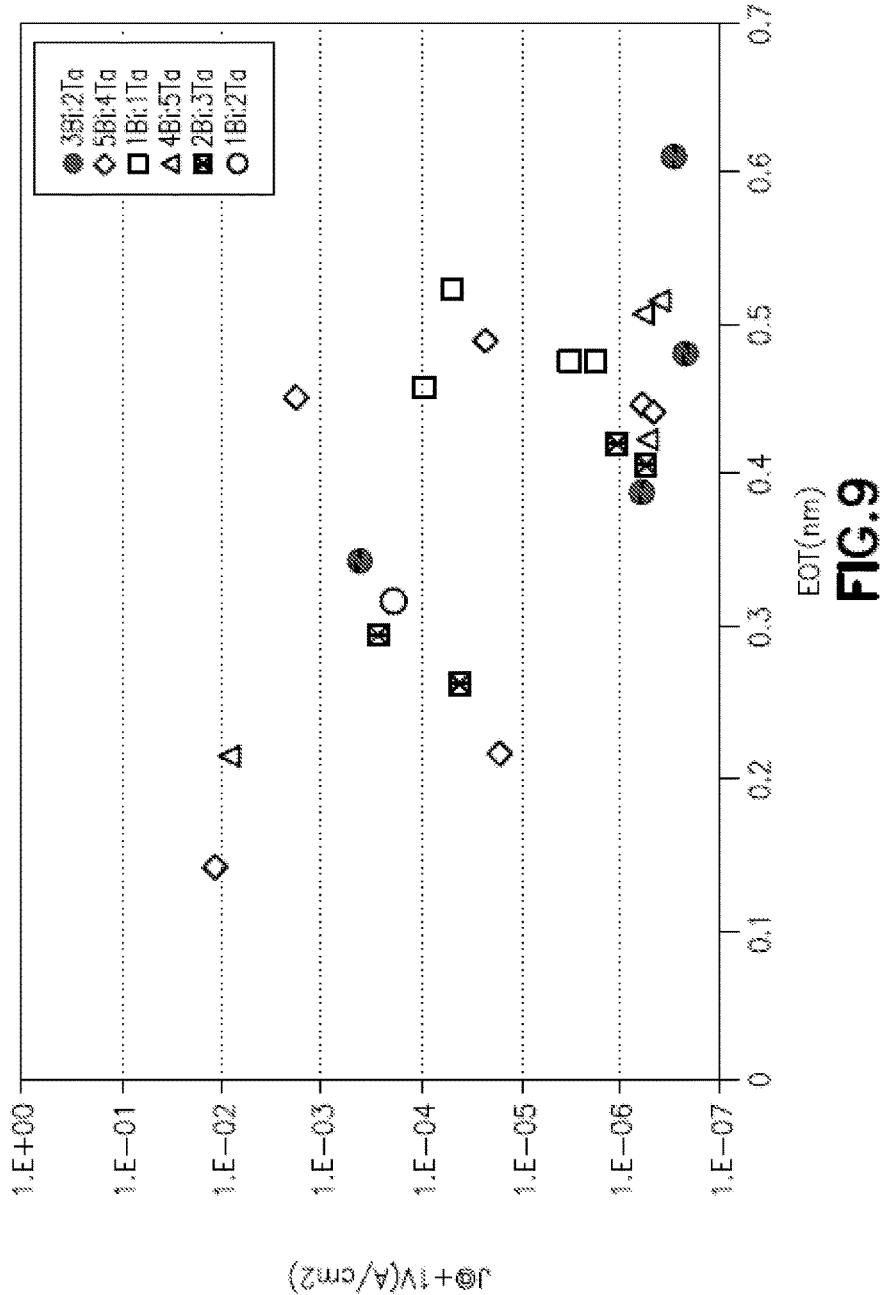
FIG. 9 is a graph of current density, J, in units of amperes per square centimeter ($A/cm^2$), as measured at +1 volt, as a function of equivalent oxide thickness (EOT), in nanometers (nm), for films of different ratios of bismuth:tantalum, namely, 3Bi:2Ta, 5Bi:4Ta, 1Bi:1Ta, 4Bi:5Ta, 2Bi:3Ta, and 1Bi:2Ta.

Baseline electrical response data are set out in FIG. 9, which is a graph of current density, J, in units of amperes per square centimeter ($A/cm^2$), as measured at +1 volt, as a function of equivalent oxide thickness (EOT), in nanometers (nm), for films of different ratios of bismuth:tantalum, namely, 3Bi:2Ta, 5Bi:4Ta, 1Bi:1Ta, 4Bi:5Ta, 2Bi:3Ta, and 1Bi:2Ta.

Figure 10:
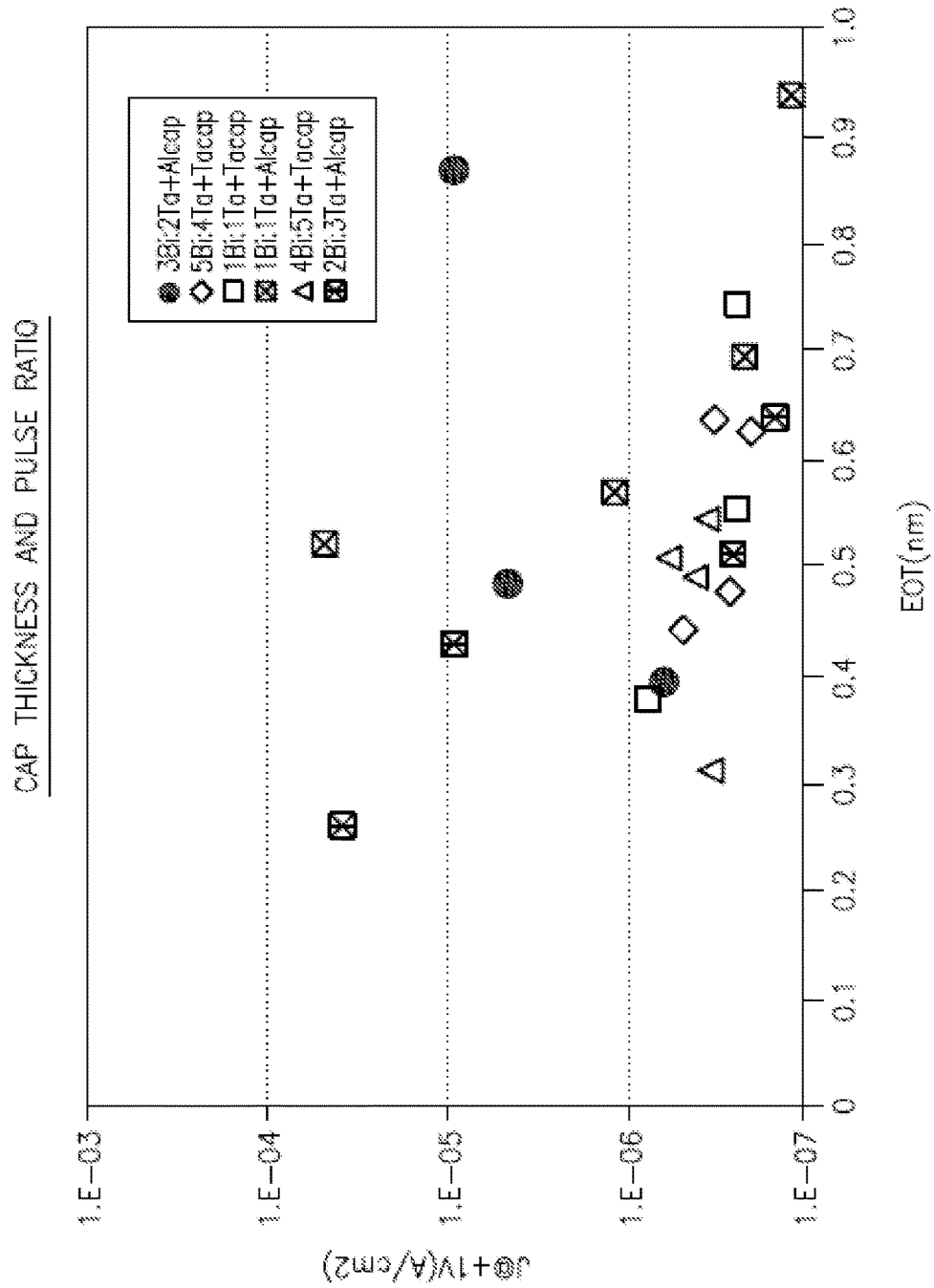
FIG. 10 is a graph of current density, J, in units of amperes per square centimeter ($A/cm^2$), as measured at +1 volt, as a function of equivalent oxide thickness (EOT), in nanometers (nm), for films of different ratios of bismuth:tantalum capped with a tantalum cap (Tacap) or an aluminum cap (Alcap), namely, 3Bi:2Ta+Alcap, 5Bi:4Ta+Tacap, 1Bi:1Ta+Tacap, 1Bi:1Ta+Alcap, 4Bi:5Ta+Tacap, and 2Bi:3Ta+Alcap.

FIG. 10 is a graph of current density, J, in units of amperes per square centimeter ($A/cm^2$), as measured at +1 volt, as a function of equivalent oxide thickness (EOT), in nanometers (nm), for films of different ratios of bismuth:tantalum capped with a tantalum cap (Tacap) or an aluminum cap (Alcap), namely, 3Bi:2Ta+Alcap, 5Bi:4Ta+Tacap, 1Bi:1Ta+Tacap, 1Bi:1Ta+Alcap, 4Bi:5Ta+Tacap, and 2Bi:3Ta+Alcap. The data do not evidence a clear benefit for relatively higher or relatively lower Bi:Ta ratios, but an increase in thickness of either tantalum cap or aluminum cap was found to decrease variability of current density.

Figure 11:
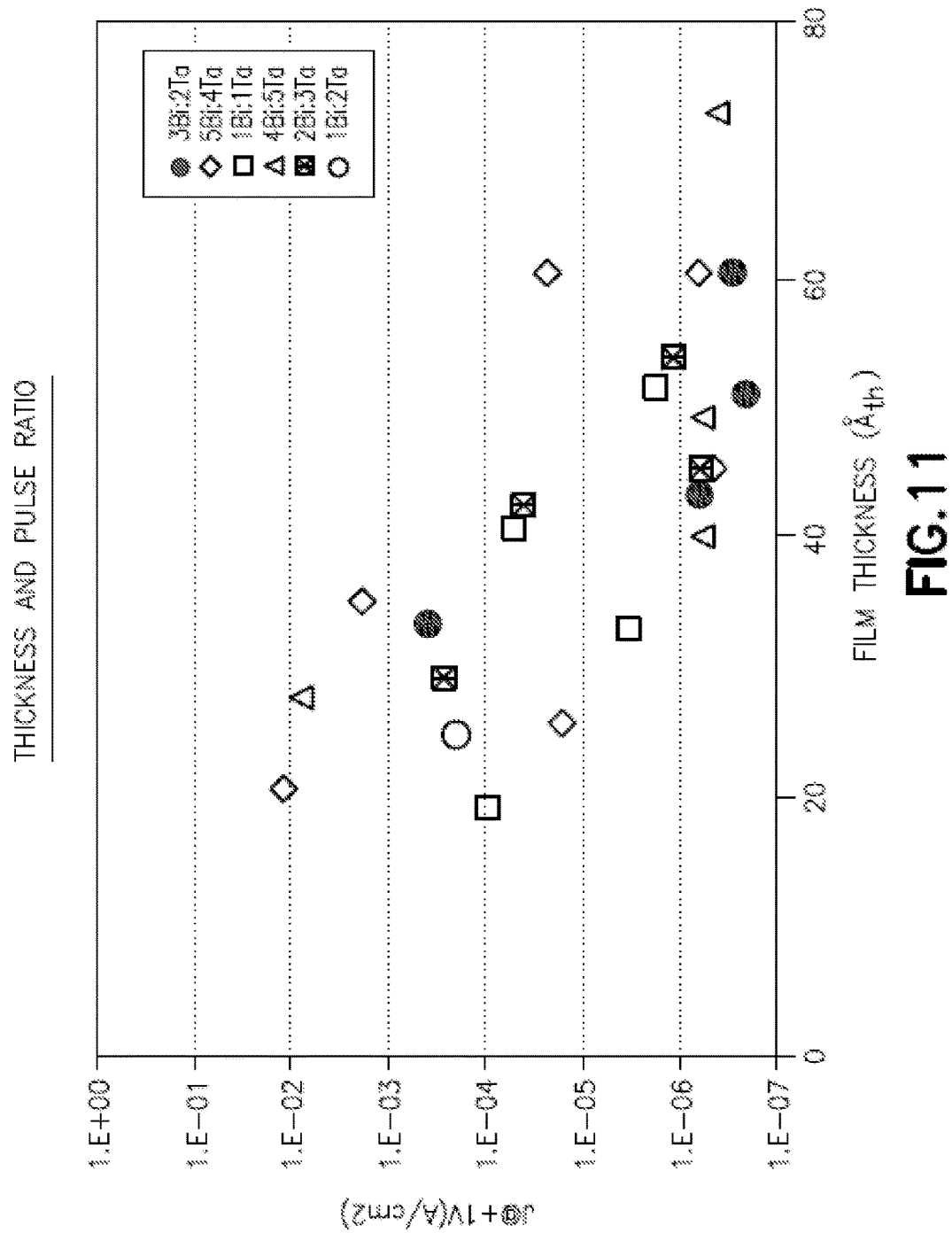
FIG. 11 is a graph of current density, J, in units of amperes per square centimeter ($A/cm^2$), as measured at +1 volt, as a function of film thickness, in Angstroms, showing the effect of film thickness and % Bi in the deposited film, for films of different ratios of bismuth:tantalum, namely, 3Bi:2Ta, 5Bi:4Ta, 1Bi:1Ta, 4Bi:5Ta, 2Bi:3Ta, and 1Bi:2Ta.

FIG. 11 is a graph of current density, J, in units of amperes per square centimeter ($A/cm^2$), as measured at +1 volt, as a function of film thickness, in Angstroms, showing the effect of film thickness and % Bi in the deposited film, for films of different ratios of bismuth:tantalum, namely, 3Bi:2Ta, 5Bi:4Ta, 1Bi:1Ta, 4Bi:5Ta, 2Bi:3Ta, and 1Bi:2Ta.

Figure 12:
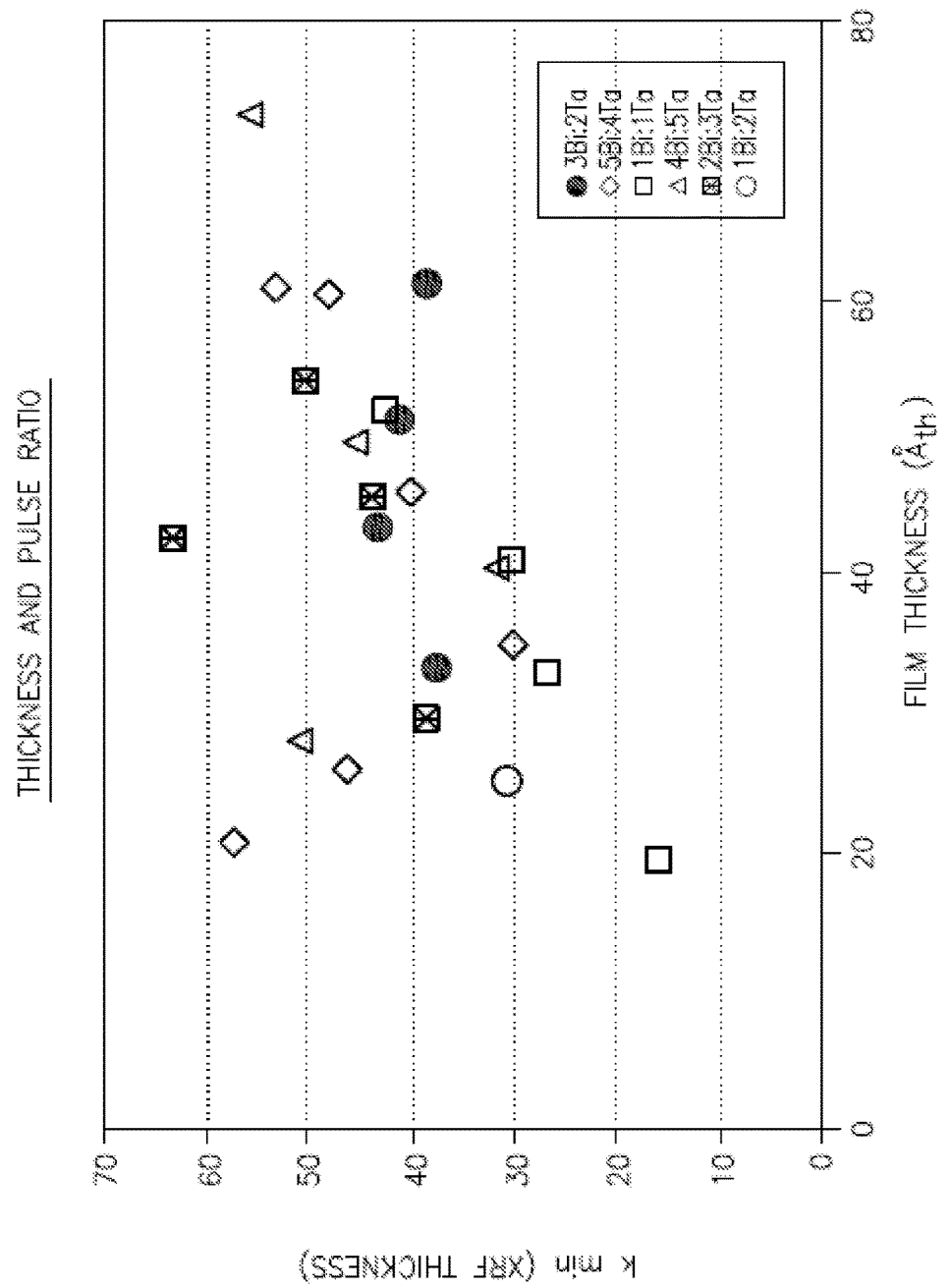
FIG. 12 is a graph of minimum dielectric constant, k min, as a function of film thickness, in Angstroms, as determined by XRF technique, showing the effect of film thickness and % Bi in the deposited film, for films of different ratios of bismuth:tantalum, namely, 3Bi:2Ta, 5Bi:4Ta, 1Bi:1Ta, 4Bi:5Ta, 2Bi:3Ta, and 1Bi:2Ta.

FIG. 12 is a graph of minimum dielectric constant, k min, as a function of film thickness, in Angstroms, as determined by XRF technique, showing the effect of film thickness and % Bi in the deposited film, for films of different ratios of bismuth:tantalum, namely, 3Bi:2Ta, 5Bi:4Ta, 1Bi:1Ta, 4Bi:5Ta, 2Bi:3Ta, and 1Bi:2Ta.

The results show that leakage values are consistent down to approximately 40 Å XRF film thickness, and that dielectric constant decreases with thickness for most films.

Table 3 below shows data for BiTaO films capped using (tert-butylimido)tris(diethylamido) tantalum (TBTDET) and ozone ($O_3$) to provide TaO capping, with post-deposition annealing of the capped film in nitrogen at 400° C. This treatment resulted in leaky BiTaO films. It was determined that 450° C. RTO was insufficient to stabilize TaOx-capped films. Table 4 below shows data for BiTaO films capped using trimethylaluminum (TMA) and ozone ($O_3$) to provide aluminum oxide ($Al_2O_3$) capping, with post-deposition annealing of the deposited film in nitrogen at 400° C. This treatment resulted in leaky BiTaO films. Table 5 below shows data for BiTaO films, with post-deposition RTO annealing of the deposited film at 450° C., followed by RTN annealing in nitrogen at 400° C.

TABLE 3

| run # | Bi:Ta | BiTaO thickness (XRF) | | | as-dep | | | | | 400 C. PDA | | |
|---|---|---|---|---|---|---|---|---|---|---|---|---|
| | | | | yield | EOT | +J | −J | kmin | yield | EOT | +J | −J |
| | | | TaO cap cycles | | | | | | | | | |
| P-165 | 5:4 | 20 | 0 | 13% | 0.14 | 1.14E−02 | 3.93E−03 | 57 | 0% | 0.27 | 1.28E+00 | 2.23E+00 |
| P-170 | 5:4 | 30 | 0 | 47% | 0.45 | 1.76E−03 | 1.41E−03 | 30 | 0% | 0.24 | 1.03E+00 | 1.15E+00 |
| P-166 | 5:4 | 40 | 0 | 93% | 0.44 | 4.73E−07 | 4.24E−07 | 40 | 57% | 0.56 | 1.25E−02 | 5.11E−03 |
| P-167 | 5:4 | 57 | 0 | 60% | 0.45 | 6.37E−07 | 4.95E−07 | 53 | 23% | 0.80 | 2.45E−02 | 1.34E−02 |
| P-168 | 5:4 | 57 | | 100% | 0.49 | 2.20E−05 | 1.03E−05 | 48 | 40% | 0.59 | 1.62E−02 | 8.65E−03 |
| P-169 | 5:4 | 40 | 10 | 100% | 0.63 | 1.92E−07 | 2.33E−07 | 34 | 0% | 0.40 | 5.68E−01 | 4.69E−01 |
| P-171 | 5:4 | 40 | 20 | 100% | 0.48 | 2.61E−07 | 2.93E−07 | 46 | 0% | 0.33 | 2.10E+00 | 1.58E+00 |
| P-172 | 5:4 | 40 | 40 | 100% | 0.64 | 3.17E−07 | 2.67E−07 | 43 | 0% | 0.33 | 1.06E+00 | 8.74E−01 |
| P-173 | 1:1 | | | 70% | 0.46 | 8.89E−05 | 3.46E−05 | 16 | 0% | 0.58 | 2.94E−01 | 5.66E−01 |
| P-174 | 1:1 | 30 | 0 | 97% | 0.48 | 3.40E−06 | 2.49E−06 | 27 | 0% | 0.45 | 6.67E−01 | 2.25E+00 |
| P-175 | 1:1 | 40 | 0 | 97% | 0.52 | 4.90E−05 | 3.10E−05 | 31 | 27% | 0.58 | 3.67E−02 | 1.85E−02 |
| P-179 | 1:1 | 50 | 0 | 93% | 0.48 | 1.73E−06 | 7.25E−07 | 42 | 0% | 0.39 | 4.85E−01 | 3.75E−01 |
| P-180 | 1:1 | 40 | 10 | 100% | 0.38 | 7.35E−07 | 9.72E−07 | 48 | 0% | 0.49 | 6.31E−01 | 5.62E−01 |
| P-181 | 1:1 | 40 | 20 | 80% | 0.55 | 2.39E−07 | 2.13E−07 | 40 | 0% | 0.33 | 2.36E+00 | 2.11E+00 |
| P-182 | 1:1 | 40 | 40 | 93% | 0.74 | 2.32E−07 | 2.37E−07 | 32 | 0% | 0.31 | 8.85E−01 | 7.26E−01 |
| P-183 | 4:5 | 30 | 0 | 40% | 0.21 | 8.00E−03 | 3.71E−03 | 51 | 0% | 0.39 | 5.21E+00 | 6.81E+00 |
| P-186 | 4:5 | 40 | 0 | 90% | 0.51 | 5.70E−07 | 4.85E−07 | 31 | 0% | 0.38 | 2.17E+00 | 1.65E+00 |
| P-184 | 4:5 | 50 | 0 | 97% | 0.43 | 5.23E−07 | 5.97E−07 | 45 | 0% | 0.44 | 6.74E−01 | 4.96E−01 |
| P-185 | 4:5 | 70 | 0 | 100% | 0.52 | 4.08E−07 | 5.18E−07 | 55 | 0% | 0.41 | 6.54E−01 | 5.72E−01 |
| P-187 | 4:5 | 40 | 10 | 100% | 0.49 | 4.01E−07 | 4.78E−07 | 35 | 10% | 0.41 | 1.85E−01 | 1.14E−01 |
| P-188 | 4:5 | 40 | 20 | 80% | 0.31 | 3.28E−07 | 3.93E−07 | 70 | 0% | 0.43 | 1.85E+00 | 1.48E+00 |
| P-189 | 4:5 | 40 | 40 | 100% | 0.54 | 3.42E−07 | 4.81E−07 | 46 | 0% | 0.39 | 8.29E−01 | 7.28E−01 |

TABLE 3-continued

|  | 450 C. RTO/400 C. RTN | | | | | |
|---|---|---|---|---|---|---|
| run # | yield | 4th best | EOT | +J | −J | kmin |
| P-165 | | | | | | |
| P-170 | | | | | | |
| P-166 | | | | | | |
| P-167 | | | | | | |
| P-168 | | | | | | |
| P-169 | | | | | | |
| P-171 | | | | | | |
| P-172 | 10% | 26 | 0.66 | 8.78E−02 | 7.82E−02 | — |
| P-173 | | | | | | |
| P-174 | | | | | | |
| P-175 | | | | | | |
| P-179 | | | | | | |
| P-180 | | | | | | |
| P-181 | | | | | | |
| P-182 | 43% | 5 | 0.62 | 1.20E−01 | 6.68E−02 | — |
| P-183 | | | | | | |
| P-186 | | | | | | |
| P-184 | | | | | | |
| P-185 | | | | | | |
| P-187 | | | | | | |
| P-188 | | | | | | |
| P-189 | 0% | 23 | 0.66 | 9.86E−02 | 8.98E−02 | — |

TABLE 4

| run # | Bi:Ta | BiTaO thickness (XRF) | TaO cap cycles | AlO cap cycles | as-dep | | | | | 400 C. PDA | | | | |
|---|---|---|---|---|---|---|---|---|---|---|---|---|---|---|
| | | | | | yield | EOT | +J | −J | kmin | yield | EOT | +J | −J | kmin |
| P-202 | 5:4 | 20 | 0 | 47% | 0.22 | 1.59E−05 | 5.03E−06 | 46 | 0% | 0.27 | 4.20E−01 | 1.75E+00 | 35 |
| P-213 | 3:2 | 30 | 0 | 50% | 0.35 | 3.90E−04 | 3.16E−04 | 38 | 0% | 0.46 | 2.84E+00 | 2.34E+00 | 28 |
| P-203 | 3:2 | 40 | 0 | 100% | 0.39 | 6.10E−07 | 6.78E−07 | 43 | 53% | 0.47 | 7.62E−02 | 2.60E−02 | 35 |
| P-222 | 3:2 | 50 | 0 | 97% | 0.48 | 2.05E−07 | 4.06E−07 | 41 | 0% | 0.43 | 1.89E+00 | 1.28E+00 | 46 |
| P-214 | 3:2 | 60 | 0 | 90% | 0.61 | 2.97E−07 | 2.73E−07 | 39 | 47% | 0.58 | 4.27E−02 | 2.07E−02 | 40 |
| P-218 | 3:2 | 40 | 5 | 93% | 0.48 | 4.54E−06 | 3.55E−06 | 35 | 0% | 0.38 | 4.13E+00 | 3.30E+00 | 43 |
| P-216 | 3:2 | 40 | 10 | 100% | 0.63 | 1.40E−07 | 1.64E−07 | 27 | 0% | 0.65 | 4.72E+00 | 4.09E+00 | 25 |
| P-215 | 3:2 | 40 | 20 | 100% | 0.87 | 9.36E−06 | 8.85E−06 | 21 | 0% | 0.61 | 2.73E−01 | 3.75E−01 | 27 |
| P-207 | 1:1 | 40 | 5 | 100% | 0.57 | 1.09E−06 | 5.81E−06 | 27 | 0% | 0.29 | 5.47E+00 | 4.81E+00 | 52 |
| P-208 | 1:1 | 40 | 10 | 100% | 0.70 | 2.20E−07 | 3.20E−07 | 25 | 0% | 0.32 | 4.67E+00 | 4.42E+00 | 50 |
| P-209 | 1:1 | 40 | 20 | 100% | 0.94 | 1.17E−07 | 1.76E−07 | 17 | 0% | 0.39 | 2.42E−01 | 3.07E−01 | 42 |
| P-223 | 1:2 | 20 | 0 | 93% | 0.32 | 1.90E−04 | 1.08E−04 | 31 | 0% | 0.46 | 5.77E+00 | 5.77E+00 | 18 |
| P-221 | 2:3 | 30 | 0 | 63% | 0.30 | 2.56E−04 | 2.08E−04 | 27 | 0% | 0.53 | 3.08E+00 | 4.62E+00 | 22 |
| P-220 | 2:3 | 40 | 0 | 60% | 0.26 | 3.81E−05 | 3.60E−05 | 63 | 0% | 0.53 | 2.11E+00 | 2.15E+00 | 29 |
| P-204 | 2:3 | 46 | 0 | 100% | 0.41 | 5.74E−07 | 6.59E−07 | 44 | 0% | 0.36 | 2.18E+00 | 1.72E+00 | 52 |
| P-219 | 2:3 | 50 | 0 | 100% | 0.42 | 1.11E−06 | 6.57E−07 | 50 | 0% | 0.31 | 2.42E+00 | 1.92E+00 | 71 |
| P-212 | 2:3 | 40 | 5 | 100% | 0.42 | 9.02E−06 | 5.82E−06 | 40 | 0% | 0.39 | 4.54E+00 | 4.14E+00 | 41 |
| P-211 | 2:3 | 40 | 10 | 100% | 0.51 | 2.53E−06 | 1.82E−07 | 31 | 0% | 0.45 | 5.80E+00 | 5.49E+00 | 39 |
| P-210 | 2:3 | 40 | 20 | 90% | 0.64 | 1.50E−07 | 1.55E−07 | 26 | 63% | 0.64 | 8.53E−02 | 9.45E−02 | 23 |

TABLE 5

| run # | Bi:Ta | BiTaO thickness (XRF) | AlO cap cycles | as-dep | | | | | 450° C. RTO/RTN | | | | |
|---|---|---|---|---|---|---|---|---|---|---|---|---|---|
| | | | | yield | EOT | +J | −J | RTN | yield | EOT | +J | −J |
| P-202 | 5:4 | 20 | 0 | 47% | 0.22 | 1.59E−05 | 5.03E−06 | 400 | 10% | 0.28 | 7.04E−04 | 5.71E−06 |
| P-213 | 3:2 | 30 | 0 | 50% | 0.35 | 3.90E−04 | 3.16E−04 | 400 | 67% | 0.54 | 5.00E−04 | 2.81E−04 |

TABLE 5-continued

| run # | Bi:Ta | BiTaO thickness (XRF) | AlO cap cycles | as-dep yield | EOT | +J | −J | RTN | 450° C. RTO/RTN yield | EOT | +J | −J |
|---|---|---|---|---|---|---|---|---|---|---|---|---|
| P-203 | 3:2 | 40 | 0 | 100% | 0.39 | 6.10E−07 | 6.78E−07 | 400 | 90% | 1.07 | 1.45E−05 | 2.88E−07 |
| P-222 | 3:2 | 50 | 0 | 97% | 0.48 | 2.05E−07 | 4.06E−07 | 400 | 90% | 1.27 | 1.39E−06 | 3.35E−07 |
| P-218 | 3:2 | 40 | 5 | 93% | 0.48 | 4.54E−06 | 3.55E−06 | 400 | 93% | 0.59 | 1.26E−02 | 2.71E−03 |
| P-208 | 1:1 | 40 | 10 | 100% | 0.70 | 2.20E−07 | 3.20E−07 | 400 | 0% | 0.78 | 4.12E+00 | 4.17E+00 |
| P-223 | 1:2 | 20 | 0 | 93% | 0.32 | 1.90E−04 | 1.08E−04 | 400 | 33% | 0.30 | 3.22E−03 | 1.49E−03 |
| P-221 | 2:3 | 30 | 0 | 63% | 0.30 | 2.56E−04 | 2.08E−04 | 400 | 50% | 0.34 | 3.76E−04 | 1.61E−04 |
| P-220 | 2:3 | 40 | 0 | 60% | 0.26 | 3.81E−05 | 3.60E−05 | 400 | 100% | 0.74 | 1.06E−05 | 4.29E−07 |
| P-204 | 2:3 | 46 | 0 | 100% | 0.41 | 5.74E−07 | 6.59E−07 | 400 | 100% | 0.44 | 1.17E−06 | 3.84E−07 |
| P-219 | 2:3 | 50 | 0 | 100% | 0.42 | 1.11E−06 | 6.57E−07 | 400 | 97% | 0.49 | 6.33E−07 | 4.45E−07 |
| P-210 | 2:3 | 40 | 20 | 90% | 0.64 | 1.50E−07 | 1.55E−07 | 400 | 60% | 0.81 | 2.64E−01 | 2.90E−01 |

The resulting annealed uncapped BiTaO films maintained low −1V leakage characteristics, and low % Bi films also maintained low +1V leakage characteristics. $AlO_x$-capped films were not stabilized with 450° C./60 s RTO.

Figure 13:
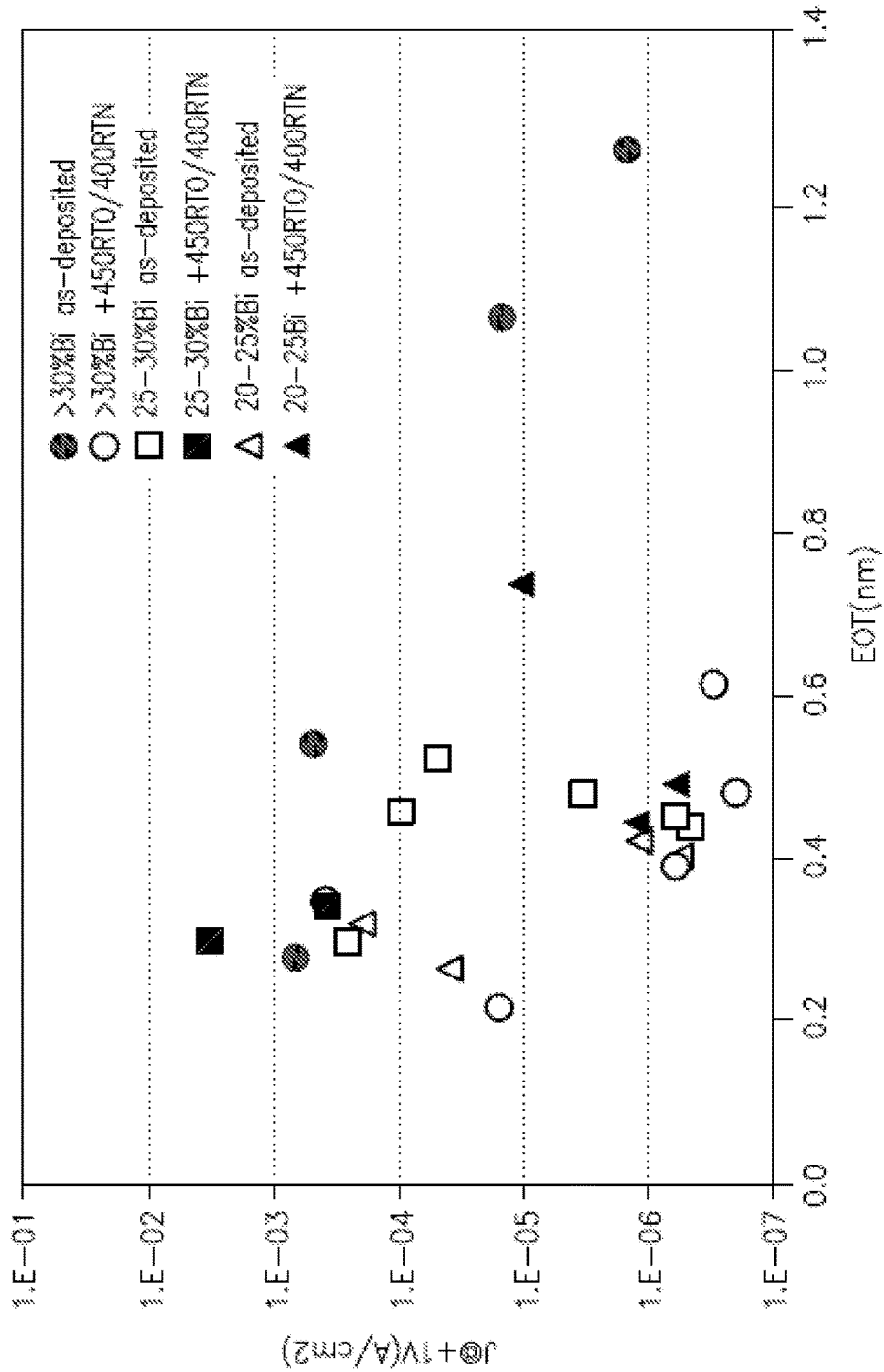
FIG. 13 is a graph of current density, J, measured at +1V, in Angstroms per square centimeter ($A/cm^2$), as a function of equivalent oxide thickness, in nanometers (nm), for the following BiTaO films: (i) >30% Bi as-deposited, (ii) >30% Bi+450 RTO/400 RTN, (iii) 25-30% Bi as-deposited, (iv) 25-30% Bi+450 RTO/400 RTN, (v) 20-25% Bi as-deposited, and (vi) 20-25% Bi+450 RTO/400 RTN.

As-deposited BiTaO films were compared with BiTaO films thermally treated by 450° C. RTO followed by 400° C. RTN, with the data shown in FIG. 13 for current density, J, measured at +1V, in Angstroms per square centimeter ($A/cm^2$), as a function of equivalent oxide thickness, in nanometers (nm), for the following BiTaO films: (i) >30% Bi as-deposited, (ii) >30% Bi+450 RTO/400 RTN, (iii) 25-30% Bi as-deposited, (iv) 25-30% Bi+450 RTO/400 RTN, (v) 20-25% Bi as-deposited, and (vi) 20-25% Bi+450 RTO/400 RTN. It is evident that varying % Bi can be used to improve the stability of the film to subsequent thermal processing.

Table 6 shows data for various RTO/RTN annealing treatments on $AlO_x$-capped $BiTaO_x$ films.

TABLE 6

| run # | Bi:Ta | BiTaO thickness (XRF) | AlO cap cycles | as-dep yield | EOT | +J | −J | RTN | 450° C. RTO/RTN yield | EOT | +J | −J |
|---|---|---|---|---|---|---|---|---|---|---|---|---|
| P-202 | 5:4 | 20 | 0 | 47% | 0.22 | 1.59E−05 | 5.03E−06 | 400 | 10% | 0.28 | 7.04E−04 | 5.71E−06 |
| P-213 | 3:2 | 30 | 0 | 50% | 0.35 | 3.90E−04 | 3.16E−04 | 400 | 67% | 0.54 | 5.00E−04 | 2.81E−04 |
| P-203 | 3:2 | 40 | 0 | 100% | 0.39 | 6.10E−07 | 6.78E−07 | 400 | 90% | 1.07 | 1.46E−05 | 2.88E−07 |
| P-222 | 3:2 | 50 | 0 | 97% | 0.48 | 2.05E−07 | 4.06E−07 | 400 | 90% | 1.27 | 1.39E−06 | 3.35E−07 |
| P-218 | 3:2 | 40 | 5 | 93% | 0.48 | 4.54E−06 | 3.55E−06 | 400 | 93% | 0.59 | 1.26E−02 | 2.71E−03 |
| P-216 | 3:2 | 40 | 10 | 100% | 0.63 | 1.40E−07 | 1.64E−07 | 450 | 0% | 1.03 | 1.83E+00 | 3.15E+00 |
| P-215 | 3:2 | 40 | 20 | 100% | 0.87 | 9.36E−06 | 8.85E−06 | 475 | 0% | 1.05 | 3.40E+00 | 7.31E+00 |
| P-207 | 1:1 | 40 | 5 | 100% | 0.57 | 1.09E−06 | 5.81E−07 | 475 | 0% | 0.35 | 9.46E+00 | 9.46E+00 |
| P-208 | 1:1 | 40 | 10 | 100% | 0.70 | 2.20E−07 | 3.20E−07 | 400 | 0% | 0.78 | 4.12E+00 | 4.17E+00 |
| P-209 | 1:1 | 40 | 20 | 100% | 0.94 | 1.17E−07 | 1.76E−07 | 450 | 0% | 0.51 | 1.77E+00 | 3.72E+00 |
| P-223 | 1:2 | 20 | 0 | 93% | 0.32 | 1.90E−04 | 1.08E−04 | 400 | 33% | 0.30 | 3.22E−03 | 1.49E−03 |
| P-221 | 2:3 | 30 | 0 | 63% | 0.30 | 2.56E−04 | 2.08E−04 | 400 | 50% | 0.34 | 3.76E−04 | 1.61E−04 |
| P-220 | 2:3 | 40 | 0 | 60% | 0.26 | 3.81E−05 | 3.60E−05 | 400 | 100% | 0.74 | 1.06E−05 | 4.29E−07 |
| P-204 | 2:3 | 46 | 0 | 100% | 0.41 | 5.74E−07 | 6.59E−07 | 400 | 100% | 0.44 | 1.17E−06 | 3.84E−07 |
| P-219 | 2:3 | 50 | 0 | 100% | 0.42 | 1.11E−06 | 6.57E−07 | 400 | 97% | 0.49 | 6.33E−07 | 4.45E−07 |
| P-212 | 2:3 | 40 | 5 | 100% | 0.42 | 9.02E−06 | 5.82E−06 | 450 | 0% | 0.50 | 9.04E−01 | 1.18E+00 |
| P-211 | 2:3 | 40 | 10 | 100% | 0.51 | 2.53E−07 | 1.82E−07 | 475 | 0% | 0.95 | 1.01E+01 | 1.01E+01 |
| P-210 | 2:3 | 40 | 20 | 90% | 0.64 | 1.50E−07 | 1.55E−07 | 400 | 60% | 0.81 | 2.64E−01 | 2.90E−01 |

| run # | RTN | 475 C. RTO/RTN yield | EOT | +J | −J |
|---|---|---|---|---|---|
| P-202 | | | | | |
| P-213 | | | | | |
| P-203 | | | | | |
| P-222 | | | | | |
| P-218 | 400 | 97% | 0.53 | 1.27E−05 | 3.68E−06 |
| P-216 | 450 | 0% | 0.46 | 1.96E+00 | 1.86E+00 |
| P-215 | 475 | 0% | 1.06 | 4.37E+00 | 8.57E+00 |
| P-207 | 475 | 0% | 0.36 | 1.22E+00 | 1.37E+00 |
| P-208 | 400 | 0% | 0.74 | 3.09E+00 | 3.25E+00 |
| P-209 | 450 | 0% | 1.20 | 2.29E+00 | 9.56E+00 |
| P-223 | | | | | |
| P-221 | | | | | |
| P-220 | | | | | |
| P-204 | | | | | |
| P-219 | | | | | |

TABLE 6-continued

| | | | | | | |
|---|---|---|---|---|---|---|
| P-212 | 450 | 40% | 0.32 | 8.45E−02 | 8.42E−02 |
| P-211 | 475 | 0% | 0.92 | 7.52E+00 | 7.52E+00 |
| P-210 | 400 | 33% | 0.86 | 2.16E−01 | 2.35E−01 |

The data show data show that 450° C. RTO does not protect the capped films from leakage degradation, and that 475° C. RTO allowed thin cap films to accommodate 400° C. RTN, evidencing that capped films require most aggressive oxidation thermal treatment conditions to retain low leakage character. The RTO in some embodiments may be carried out in a temperature range of from 400° C. to 600° C., in other embodiments in a temperature range of from 450° C. to 575° C., and in still other embodiments in a temperature range of from 475° C. to 575° C.

The foregoing results show that RTO can be used to effectively stabilize BiTaO$_x$ films against degradation that would otherwise occur as a consequence of RTN processing. RTO conditions necessary for stabilization of BiTaO$_x$ films include higher temperature and/or longer RTO processing time than the conditions required for uncapped BiTaO$_x$ films. Additional stability can be imparted to BiTaO$_x$ films with minimum thermal exposure by applying RTO, then capping, then depositing a top electrode using less-oxidizing (or reducing) conditions.

Another aspect of the disclosure relates to compositional modulation of BiTaO films to enhance their stability, and specifically to enhancing BiTaO film robustness in respect of film dielectric constant and leakage current when such film is thermally treated for top electrode deposition in microelectronic device fabrication applications.

The disclosure in such aspect provides improved BiTaO films that do not have a uniform Bi:Ta ratio. Instead, the Bi:Ta ratio is modulated through the thickness of the film. The thermal performance of such films is related to the modulation depth and modulation periods.

Set out in Table 7 below is a compilation of information for various BiTaO films, including ultra-low Bi % films (films in this category having a bismuth concentration in the film of from 8-10%), high Bi % films modulated according to modulated Scheme 1 (films in this category having a bismuth concentration in the film of from 18-30%), and high Bi % films modulated according to modulated Scheme 2 (films in this category having a bismuth concentration in the film of from 20-28%). The wafers are specified by identification numbers in such table, together with an identification of the XRF thickness of the film, the Bi % of the film, and the treatment of the film (As Dep=as deposited; RTN 450° C.=rapid thermal nitridation at 450° C.; and RTO 450° C.=rapid thermal oxidation at 450° C.).

TABLE 7

| BiTaO films | Wafer No. | XRF Thickness | Bi % | Treatment |
|---|---|---|---|---|
| Ultra-low | BiTaO-323R | 59.14 | 8.3% | As Dep |
| Bi % films | BiTaO-323L1 | 62.83 | 8.2% | RTN 450° C. |
| (<10% Bi) | BiTaO-323L2 | 48.25 | 9.2% | RTO 450° C. |
| High Bi % | BiTaO-325R | 60.25 | 28% | As Dep |
| films | BiTaO-325L1 | 56.2 | 28% | RTN 450° C. |
| (modulated Scheme 1) | BiTaO-325L2 | 58.7 | 19.4% | RTO 450° C. |
| High Bi % | BiTaO-326R | 67.03 | 22.1% | As Dep |
| films | BiTaO-326L1 | 65.2 | 22.6% | RTN 450° C. |
| (modulated Scheme 2) | BiTaO-326L2 | 54.88 | 26.6% | RTO 450° C. |

In forming these films, the bismuth precursor used was BiMe$_2$(Me$_2$NCH$_2$Ph),

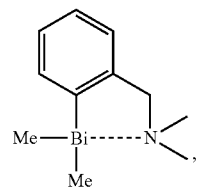

and the tantalum precursor was tris(diethylamino)(tert-butylimido)tantalum, (TBTDETa). In the samples that were treated by rapid thermal processing, either rapid thermal nitridation or rapid thermal oxidation, the rapid thermal processing techniques were carried out at temperature of 450° C. The substrate was titanium nitride (TiN).

The Modulated Scheme 1 deposition process involved initial deposition of the mixed metals at a ratio of Bi:Ta of 3:1 to achieve a film thickness of 10 Å, intermediate deposition of mixed metals at a ratio of Bi:Ta of 1:1 to achieve additional film thickness of 20 Å, and final deposition of mixed metals at a ratio of Bi:Ta of 3:1 to achieve additional film thickness of 20 Å.

The Modulated Scheme 2 deposition process involved initial deposition of the mixed metals at a ratio of Bi:Ta of 1:1 to achieve a film thickness of 10 Å, followed by deposition of mixed metals at a ratio of Bi:Ta of 3:1 to achieve additional film thickness of 10 Å, followed by deposition of mixed metals at a ratio of Bi:Ta of 1:1 to achieve additional film thickness of 10 Å, followed by deposition of mixed metals at a ratio of Bi:Ta of 3:1 to achieve additional film thickness of 20 Å, and final deposition of mixed metals at a ratio of Bi:Ta of 1:2 to achieve additional film thickness of 10 Å.

FIGS. 14-17 are corresponding graphs of current density, J, in amperes per square centimeter (A/cm$^2$) at voltage of +1 v, as a function of equivalent oxide thickness (EOT), in nanometers, for BiTaO films deposited by atomic layer deposition.

Figure 14:
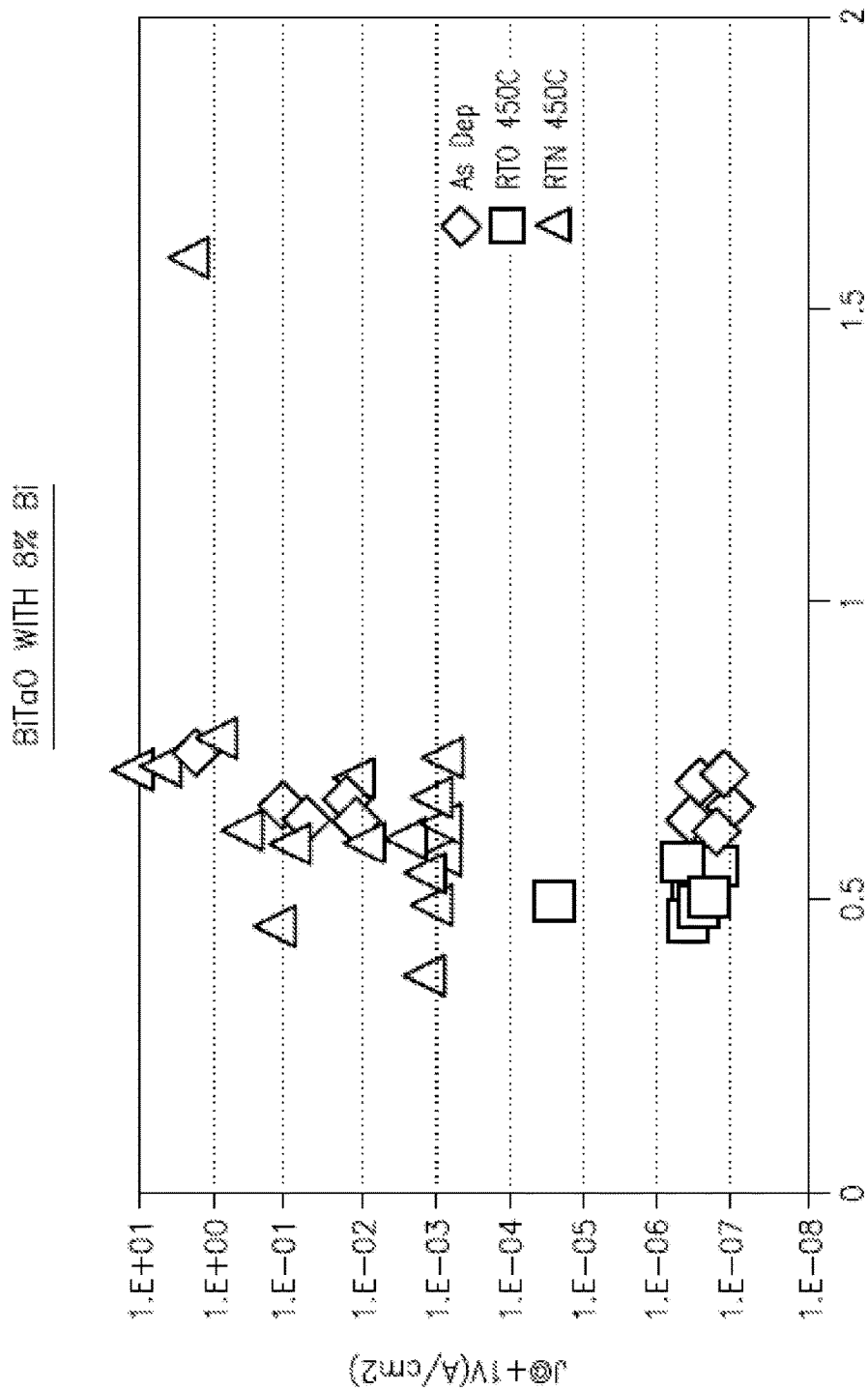
FIG. 14 is a graph of current density, J, in amperes per square centimeter ($A/cm^2$) at voltage of +1 v, as a function of equivalent oxide thickness (EOT), in nanometers, for BiTaO films containing 8% Bi, including 8% Bi-containing BiTaO films as deposited (♦), 8% Bi-containing BiTaO films processed by rapid thermal oxidation at 450° C. (■), and 8% Bi-containing BiTaO films processed by rapid thermal nitridation at 450° C. (▲).

FIG. 14 shows the plotted film values for BiTaO films containing 8% Bi, including 8% Bi-containing BiTaO films as deposited (♦), 8% Bi-containing BiTaO films processed by rapid thermal oxidation at 450° C. (■), and 8% Bi-containing BiTaO films processed by rapid thermal nitridation at 450° C. (▲). These low-bismuth films were uniform in composition and stable in character as regards their current density characteristics.

Figure 15:
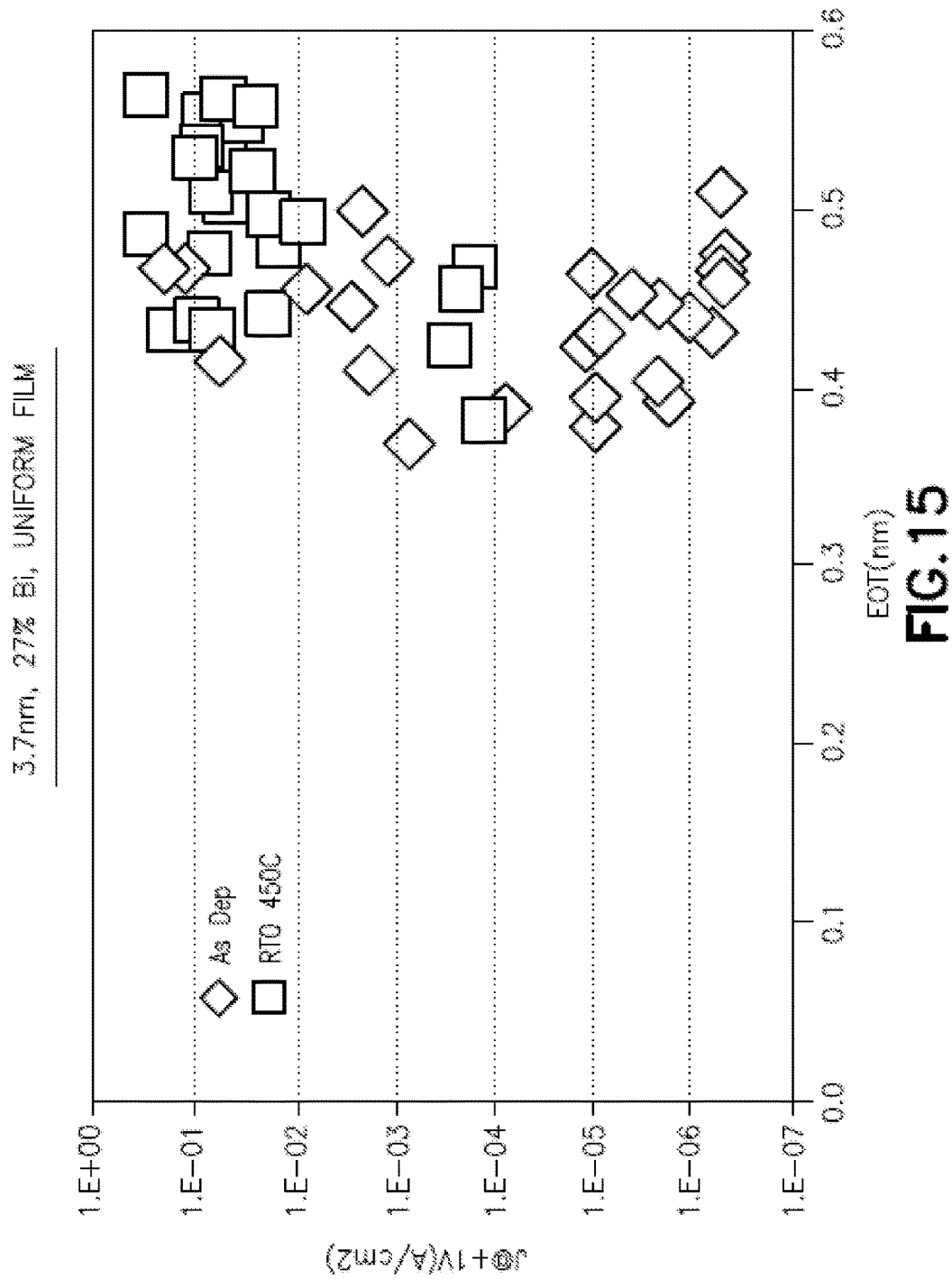
FIG. 15 is a graph of current density, J, in amperes per square centimeter ($A/cm^2$) at voltage of +1 v, as a function of equivalent oxide thickness (EOT), in nanometers, for uniform composition films at higher bismuth content of 27% Bi and thickness of 3.7 nm, including 27% Bi-containing BiTaO films as deposited (♦), and 27% Bi-containing BiTaO films processed by rapid thermal oxidation at 450° C. (■).

FIG. 15 shows the data for uniform composition films at higher bismuth content of 27% Bi and thickness of 3.7 nm, including 27% Bi-containing BiTaO films as deposited (♦), and 27% Bi-containing BiTaO films processed by rapid thermal oxidation at 450° C. (■). These high-Bi uniform composition films were of reduced stability character, as compared to the films of FIG. 14.

Figure 16:
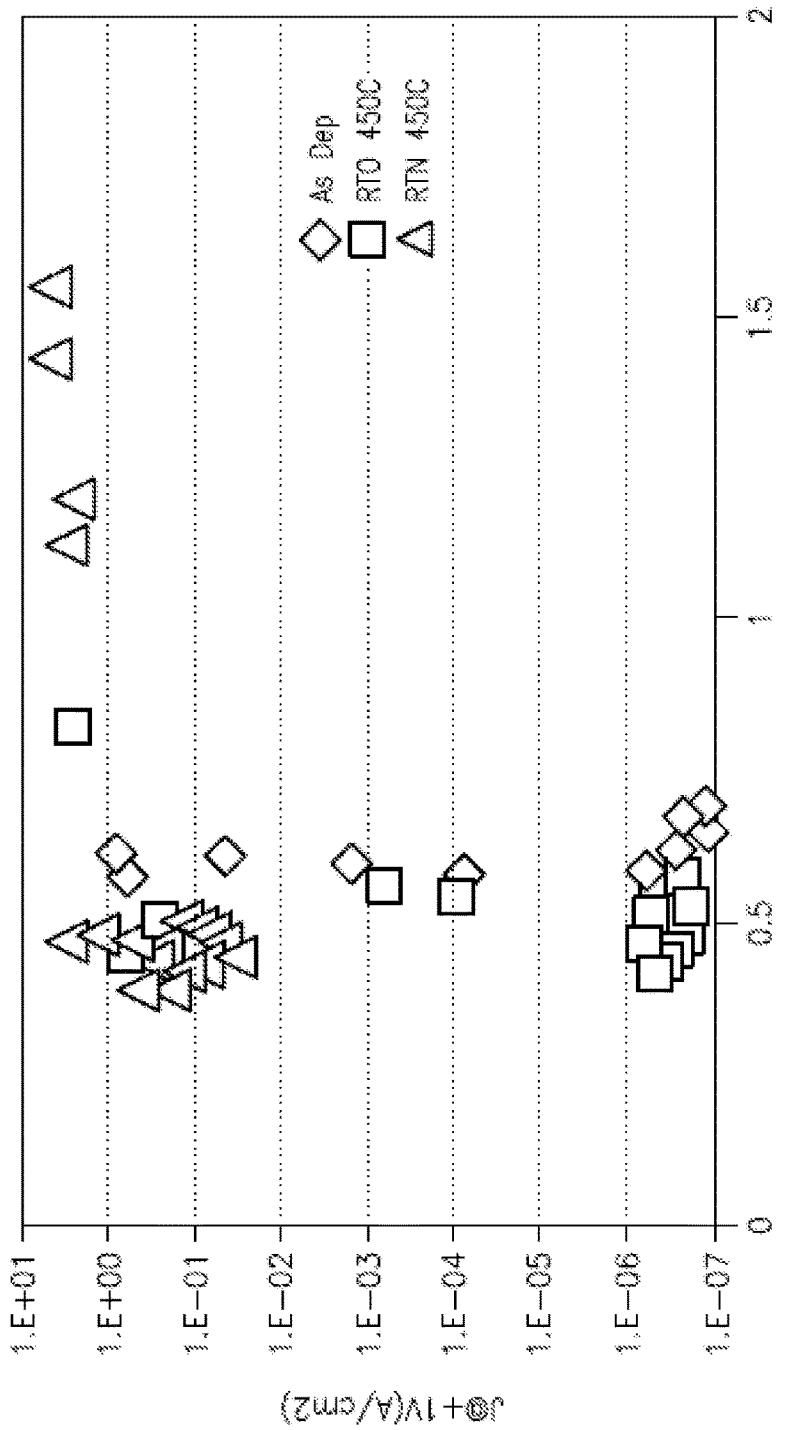
FIG. 16 is a graph of current density, J, in amperes per square centimeter ($A/cm^2$) at voltage of +1 v, as a function of equivalent oxide thickness (EOT), in nanometers, for compositionally modulated films in which deposition was carried out according to Modulated Scheme 1, including films as deposited (♦), as processed by rapid thermal oxidation at 450° C. (■), and as processed by rapid thermal nitridation at 450° C. (▲).

FIG. 16 shows the data for compositionally modulated films in which deposition was carried out according to Modulated Scheme 1, including films as deposited (♦), as processed by rapid thermal oxidation at 450° C. (■), and as processed by rapid thermal nitridation at 450° C. (▲).

Figure 17:
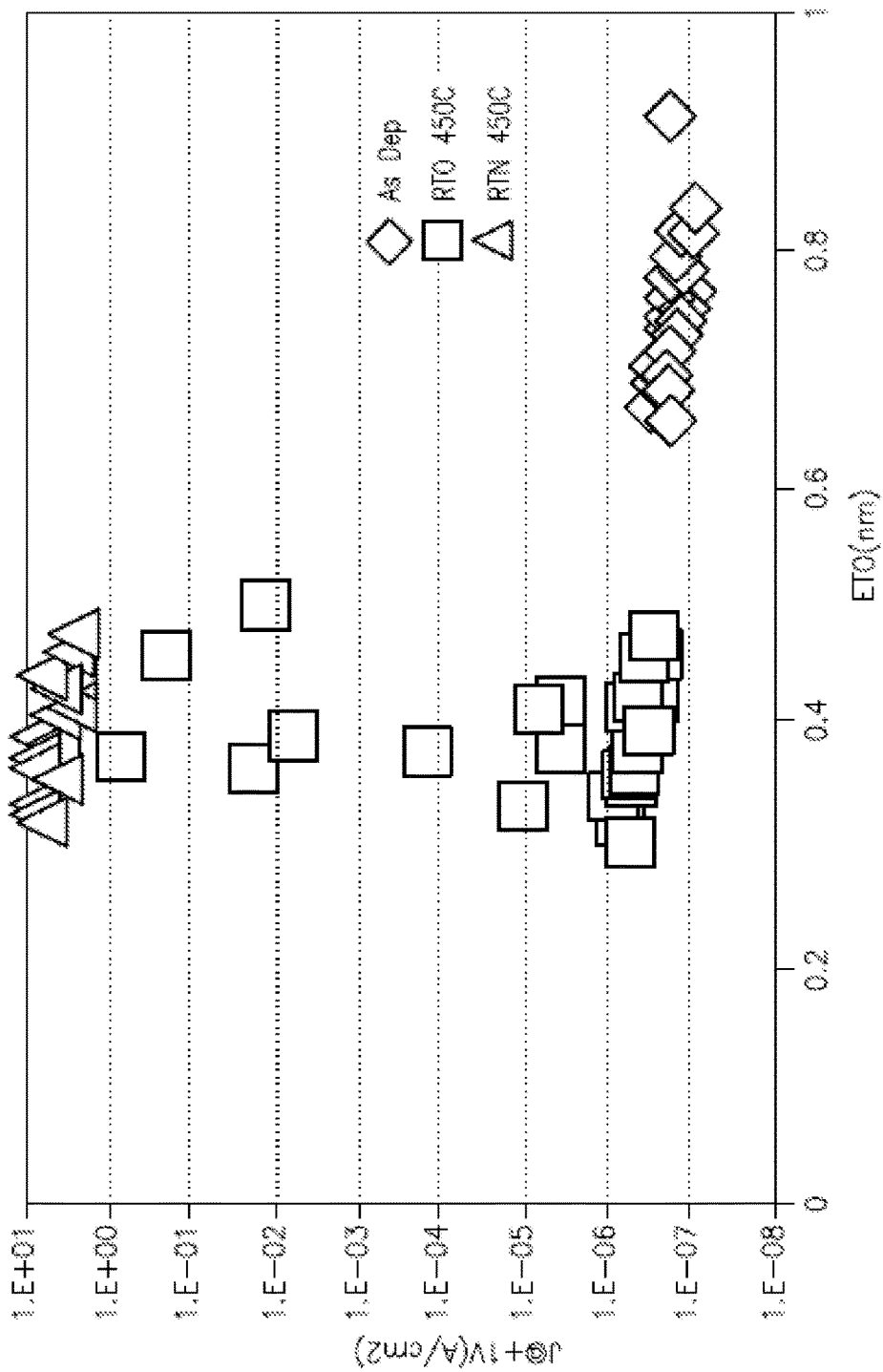
FIG. 17 is a graph of current density, J, in amperes per square centimeter ($A/cm^2$) at voltage of +1 v, as a function of equivalent oxide thickness (EOT), in nanometers, for compositionally modulated films in which deposition was carried out according to Modulated Scheme 2, including films as deposited (♦), as processed by rapid thermal oxidation at 450° C. (■), and as processed by rapid thermal nitridation at 450° C. (▲).

FIG. 17 shows the data for compositionally modulated films in which deposition was carried out according to Modulated Scheme 2, including films as deposited (♦), as processed by rapid thermal oxidation at 450° C. (■), and as processed by rapid thermal nitridation at 450° C. (▲).

The foregoing data for current density as a function of ETO showed that the compositionally modulated films of FIGS. 16-17 were better than the uniform composition 27% Bi film of FIG. 15, with respect to stability characteristics. The data therefore evidence that stability of the mixed metal oxide film when homogeneous in composition is satisfactory at low Bi level (FIG. 14) but is deteriorated at high Bi level, whereas compositional modulation of the mixed oxide film enables high Bi levels to be achieved without such loss of stability.

Accordingly, the disclosure contemplates high dielectric constant ($k \geq 40$), low leakage current ($\leq 10^{-6}$ A/cm$^2$ at 0.6 nm or lower equivalent oxide thickness) non-crystalline metal oxide, including two or more compatible metals selected from the group consisting of bismuth, tantalum, niobium, barium, strontium, calcium, magnesium, titanium, zirconium, hafnium, tin, and lanthanide series metals, in which the metal oxide comprises different relative proportions of the metals therein.

The metal oxide may be in the form of a thin film comprising at least two thickness portions of differing relative proportions of the metals.

The disclosure correspondingly contemplates a process of forming a high dielectric constant, low leakage current non-crystalline metal oxide, including two or more compatible metals selected from the group consisting of bismuth, tantalum, niobium, barium, strontium, calcium, magnesium, titanium, zirconium, hafnium, tin, and lanthanide series metals, comprising vapor depositing the metals on a substrate at at least two differing ratios of the metals during said depositing, so that the metal oxide comprises different relative proportions of the metals therein, for enhancement of stability of such metal oxide. The metals, for example, may be deposited to form a thin film comprising at least two thickness portions of differing relative proportions of the metals.

The disclosure correspondingly contemplates BiTaO and methods of forming same, involving the aforementioned compositional modulation to provide such mixed metal oxide with differing metals ratios therein, for enhancement of stability of such oxide.

While the disclosure has been set out herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A high dielectric constant, low leakage current non-crystalline metal oxide, comprising an oxide of two or more compatible metals selected from the group consisting of bismuth, tantalum, niobium, barium, strontium, calcium, magnesium, titanium, zirconium, hafnium, tin, and lanthanide series metals, the metal oxide having a dielectric constant in a range of from 40 to 75, and a leakage current in a range of from $10^{-6}$ A/cm$^2$ to $10^{-9}$ A/cm$^2$ at 0.6 nm or lower equivalent oxide thickness, in a microelectronic device structure including a bottom electrode on which the high dielectric constant, low leakage current non-crystalline metal oxide is deposited, and a top electrode formed on the high dielectric constant, low leakage current non-crystalline metal oxide, optionally with a metal oxide capping layer between the high dielectric constant, low leakage current non-crystalline metal oxide and the top electrode.

2. The high dielectric constant, low leakage current non-crystalline metal oxide of claim 1, comprising metal oxide selected from the group consisting of BiTaO, LnTaO, LnTiO, (Ba,Sr) tetratitanates, and ZrTiSnO, wherein Ln comprises a lanthanide series metal.

3. The high dielectric constant, low leakage current non-crystalline metal oxide of claim 1, comprising BiTaO.

4. The high dielectric constant, low leakage current non-crystalline metal oxide of claim 1, in which the metal oxide comprises different relative proportions of the metals therein.

5. The high dielectric constant, low leakage current non-crystalline metal oxide of claim 1, wherein the high dielectric constant, low leakage current non-crystalline metal oxide is annealed at a temperature below crystallization temperature.

6. The high dielectric constant, low leakage current non-crystalline metal oxide of claim 3, wherein metal proportions are 3Bi:2Ta.

7. The high dielectric constant, low leakage current non-crystalline metal oxide of claim 3, wherein metal proportions are 5Bi:4Ta.

8. The high dielectric constant, low leakage current non-crystalline metal oxide of claim 3, wherein metal proportions are 1Bi:1Ta.

9. The high dielectric constant, low leakage current non-crystalline metal oxide of claim 3, wherein metal proportions are 4Bi:5Ta.

10. The high dielectric constant, low leakage current non-crystalline metal oxide of claim 3, wherein metal proportions are 2Bi:3Ta.

11. The high dielectric constant, low leakage current non-crystalline metal oxide of claim 3, wherein metal proportions are 1Bi:2Ta.

12. A high dielectric constant, low leakage current non-crystalline metal oxide, comprising LnTaO, wherein Ln comprises a lanthanide series metal.

13. A high dielectric constant, low leakage current non-crystalline metal oxide, comprising LnTiO, wherein Ln comprises a lanthanide series metal.

14. A high dielectric constant, low leakage current non-crystalline metal oxide, comprising ZrTiSnO.

* * * * *